(12) United States Patent
Yoshida et al.

US008648151B2

(10) Patent No.: US 8,648,151 B2
(45) Date of Patent: Feb. 11, 2014

(54) PIEZOELECTRIC POLYMER MATERIAL, PROCESS FOR PRODUCING SAME, AND PIEZOELECTRIC ELEMENT

(75) Inventors: Mitsunobu Yoshida, Icihara (JP); Masanobu Ajioka, Chiba (JP); Kenichi Goto, Chiba (JP); Ichiro Fujio, Nagaokakyo (JP); Takaharu Isaki, Chiba (JP); Takayuki Onogi, Chiba (JP); Yoshiro Tajitsu, Suita (JP); Shinichi Usugi, Chiba (JP); Takeshi Karino, Ichihara (JP); Yoshiaki Aso, Mobara (JP)

(73) Assignees: Mitsui Chemicals, Inc., Minato-Ku, Tokyo (JP); A School Corporation Kansai University, Suita-Shi, Osaka (JP)

( * ) Notice: Subject to any disclaimer, the term of this patent is extended or adjusted under 35 U.S.C. 154(b) by 0 days.

(21) Appl. No.: 13/256,098

(22) PCT Filed: Mar. 15, 2010

(86) PCT No.: PCT/JP2010/054294
§ 371 (c)(1),
(2), (4) Date: Sep. 12, 2011

(87) PCT Pub. No.: WO2010/104196
PCT Pub. Date: Sep. 16, 2010

(65) Prior Publication Data
US 2012/0025674 A1     Feb. 2, 2012

(30) Foreign Application Priority Data

Mar. 13, 2009 (JP) ................... 2009-061401
Mar. 13, 2009 (JP) ................... 2009-061402

(51) Int. Cl.
*C08G 18/62* (2006.01)
(52) U.S. Cl.
USPC .......... 525/450; 252/62.9; 264/291; 264/479; 525/410; 525/411; 525/415; 528/361; 528/502 B

(58) Field of Classification Search
USPC .......... 252/62.9; 264/479, 291; 525/410, 411, 525/415, 450; 528/361, 502 B
See application file for complete search history.

(56) References Cited

U.S. PATENT DOCUMENTS 5,298,602 A * 3/1994 Shikinami et al. ............ 528/361

FOREIGN PATENT DOCUMENTS

| JP | 5-152638 A | 6/1993 | |
|----|-----------|--------|---|
| JP | 6-23836 A | 2/1994 | |
| JP | 2000-086877 A | 3/2000 | |
| JP | 2005-203590 A | 7/2005 | |
| JP | 2005-213376 * | 8/2005 | .............. C08L 67/04 |
| JP | 2005-213376 A | 8/2005 | |
| JP | 2009-040948 A | 2/2009 | |

OTHER PUBLICATIONS

International Search Report (PCT/ISA/210) issued on Apr. 6, 2010, by Japanese Patent Office as the International Searching Authority for International Application No. PCT/JP2010/054294.
Written Opinion (PCT/ISA/237) issued on Apr. 6, 2010, by Japanese Patent Office as the International Searching Authority for International Application No. PCT/JP2010/054294.
Keiko Koga et al., Piezoelectricity of poly-L-lactic acid, Research Report No. 37 From Engineering Department at Kyusyu Sangyo University, Japan, Dec. 22, 2000, pp. 175-178.
Office Action issued in corresponding Japanese Patent Application No. 2011-503888, dated May 21, 2013 with English translation.

* cited by examiner

*Primary Examiner* — Robert Jones, Jr.
(74) *Attorney, Agent, or Firm* — Buchanan Ingersoll & Rooney PC

(57) ABSTRACT

The invention provides a piezoelectric polymer material including a helical chiral polymer having a weight average molecular weight of from 50,000 to 1,000,000 and having optical activity, the piezoelectric polymer material having a piezoelectric constant $d_{14}$ at 25° C. of 10 pC/N or more, a degree of crystallinity obtained by X-ray diffraction of from 40% to 80%, and a haze of from 0.5 to 30.

15 Claims, 11 Drawing Sheets

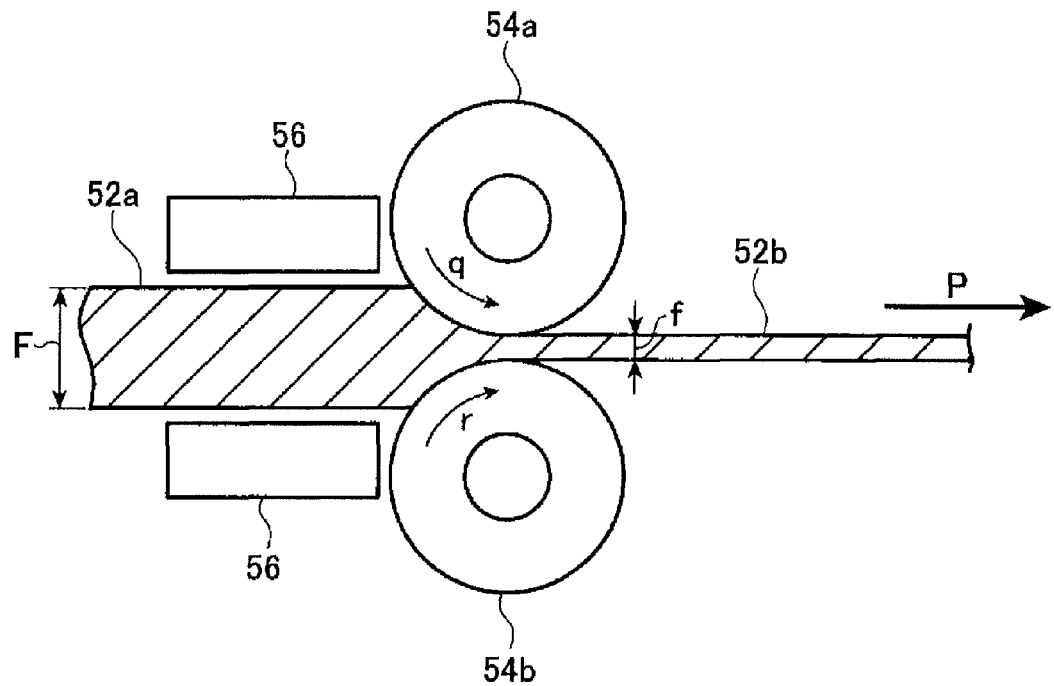
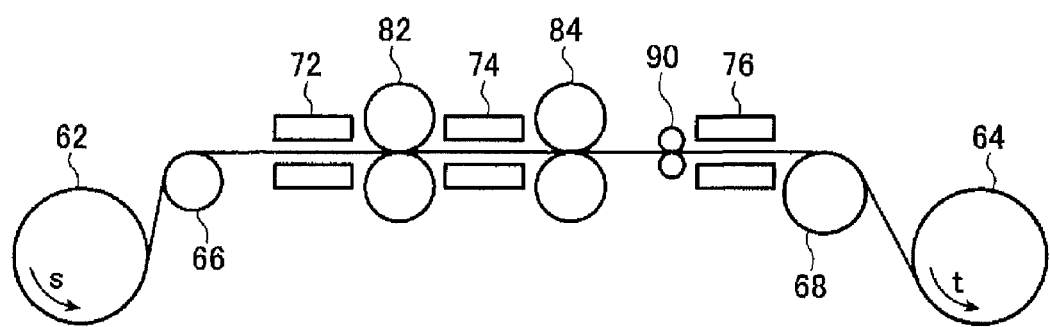
FIG. 4

PIEZOELECTRIC POLYMER MATERIAL, PROCESS FOR PRODUCING SAME, AND PIEZOELECTRIC ELEMENT

TECHNICAL FIELD

The present invention relates to a piezoelectric polymer material, a process for producing the same, and a piezoelectric element.

BACKGROUND ART

As a piezoelectric material, PZT (a PBZrO$_3$—PbTiO$_3$ solid solution), which is a ceramic material, has been used in many cases. However, since PZT contains lead, piezoelectric polymer materials having a low environmental impact and a high flexibility have been increasingly employed.

Currently known piezoelectric polymer materials are roughly classified mainly into the following three types, i.e., poled polymers typified by nylon 11, polyvinyl fluoride, polyvinyl chloride and polyurea, polyvinylidene fluoride (β type) (PVDF), and ferroelectric polymers typified by a polyvinylidene fluoride-trifluoroethylene copolymer (P(VDF-TrFE)) (75/25).

However, since piezoelectric polymer materials are inferior to PZT in piezoelectricity, improvement in piezoelectricity is demanded. Thus, attempts have been made from various standpoints in order to improve the piezoelectricity of piezoelectric polymer materials.

For example, PVDF and P(VDF-TrFE), which are ferroelectric polymers, exhibit excellent piezoelectricity among polymers, and the piezoelectric constant d$_{31}$ thereof is 20 pC/N or more. Film materials formed from PVDF and P(VDF-TrFE) are imparted with piezoelectricity by carrying out a drawing process in which polymer chains are oriented in a drawing direction; generating an electric field in a direction longitudinal to a film surface by providing different types of charges to a front side and a back side of the film by corona discharge or the like; and allowing permanent dipoles containing fluoride existing in a side chain of the polymer chains to be oriented in a direction parallel to the electric field direction. However, there has been a problem in practical use in that different types of charges, such as water or ions contained in air, are likely to adhere to the polarized film surface in a direction of canceling orientation; therefore, orientation of the aligned permanent dipoles may tend to cause a significant decrease in piezoelectricity over time.

PVDF is a material having the highest piezoelectricity among the piezoelectric polymer materials described above. However, since PVDF has a relatively high dielectric constant among the piezoelectric polymer materials, i.e., 13, the material has a small piezoelectric g constant (open-circuit voltage per unit stress), which is a value obtained by dividing the piezoelectric d constant by the dielectric constant. Further, although PVDF exhibits a favorable conversion efficiency from electricity to sound, a conversion efficiency from sound to electricity has yet to be improved.

In recent years, use of polymers having optical activity, such as polypeptide or polylactic acid, is attracting attention, in addition to the piezoelectric polymer materials described above. Optically active polymers are known to demonstrate piezoelectricity by carrying out a mechanical drawing alone.

Among the polymers having optical activity, piezoelectricity of polymer crystals, such as polylactic acid, originates from permanent dipoles of a C═O bond being present in a screw axis direction. In particular, polylactic acid, which has a small volume fraction of a side chain to a main chain and a high ratio of permanent dipoles per volume, is an ideal polymer among polymers having helical chirality.

It is known that polylactic acid, which demonstrates piezoelectricity by a drawing process alone, does not require a poling process, and that the piezoelectric modulus does not decrease over the years.

As described above, polylactic acid has various types of piezoelectric properties, and thus, piezoelectric polymer materials using various kinds of polylactic acids have been reported.

For example, a piezoelectric polymer material that exhibits a piezoelectric modulus of approximately 10 pC/N at room temperature, obtained by subjecting a molded article of polylactic acid to a drawing process, is disclosed (see, for example, Japanese Patent Application Laid-Open (JP-A) No. 5-152638).

Moreover, in order to obtain highly oriented polylactic acid crystals, performing a special orientation process referred to as a forging method to achieve a piezoelectricity of approximately 18 pC/N has also been reported (e.g., JP-A No. 2005-213376).

DISCLOSURE OF THE INVENTION

Object to be Addressed

The piezoelectric modulus of about 10 pC/N, disclosed in JP-A No. 5-152638, is a relatively high value among polymers that demonstrate piezoelectricity by a drawing process alone, but is lower than that of ferroelectric polymers that require a poling process.

According to the method disclosed in JP-A No. 2005-213376, it is extremely difficult to produce a uniform film over a large area, and the range of applications in which polylactic acid-based piezoelectric materials can be used is limited.

Moreover, all of the piezoelectric materials disclosed in JP-A Nos. 5-152638 and 2005-213376 exhibit insufficient transparency.

In view of the aforementioned circumstances, it is an object of the present invention to provide a piezoelectric polymer material that requires no poling process, exhibits a large piezoelectric constant d$_{14}$, and exhibits excellent transparency and elasticity; a piezoelectric element; and a process for producing a piezoelectric polymer material.

Means for Addressing the Object

The following are specific measures for achieving the object.

<1> A piezoelectric polymer material comprising a helical chiral polymer having a weight average molecular weight of from 50,000 to 1,000,000 and having optical activity, the piezoelectric polymer material having a piezoelectric constant d$_{14}$ at 25° C. of 10 pC/N or more, a degree of crystallinity obtained by X-ray diffraction of from 40% to 80%, and a haze of from 0.5 to 30.

<2> The piezoelectric polymer material according to <1>, wherein the helical chiral polymer comprises a repeating unit represented by the following Formula (I) as a main chain:

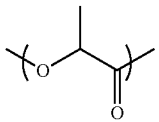

(1)

<3> The piezoelectric polymer material according to <1> or <2>, wherein the piezoelectric polymer material is a piezoelectric polymer material P1, the piezoelectric polymer material P1 having a continuous structure of a low crystal phase and a high crystal phase with a structure cycle of 12.5 nm to 80.0 nm in a direction substantially parallel with a screw axis of a spiral structure of the helical chiral polymer, and substantially not having the continuous structure in a direction substantially parallel with one direction orthogonal to the screw axis, and wherein the piezoelectric polymer material has a difference between Tm1 and Tm2 of from 2° C. to 10° C., Tm1 being the highest melting point derived from the helical chiral polymer among melting points of the piezoelectric polymer material P1 obtained by differential scanning calorimetry, and Tm2 being a melting point derived from the helical chiral polymer of a piezoelectric polymer material P2 obtained by differential scanning calorimetry, the piezoelectric polymer material P2 being obtained by heating the piezoelectric polymer material P1 to Tm1+15° C., melting for 5 minutes, and then cooling to 0° C. at −10° C./min.

<4> The piezoelectric polymer material according to <3>, wherein when the piezoelectric polymer material has two or more melting points derived from the helical chiral polymer obtained by differential scanning calorimetry, the difference between the lowest melting point Tm3 among the melting points and the melting point Tm1 is within 30° C.

<5> The piezoelectric polymer material according to <3> or <4>, wherein the melting point Tm1 is 160° C. or more and lower than 250° C.

<6> The piezoelectric polymer material according to any one of <1> to <5>, wherein the helical chiral polymer has an optical purity of 99.00% ee or more.

<7> The piezoelectric polymer material according to any one of <1> to <6>, wherein the piezoelectric polymer material has a product of an α crystal content, a degree of crystallinity [%] and a degree of orientation, which are obtained by X-ray diffraction, of 3.0 or more and lower than 100.

<8> The piezoelectric polymer material according to any one of <1> to <7>, wherein the piezoelectric polymer material has a degree of orientation obtained by X-ray diffraction of 0.90 or more.

<9> The piezoelectric polymer material according to any one of <3> to <8>, wherein the piezoelectric polymer material is obtained by carrying out a drawing process at a temperature higher than the glass transition temperature Tg of the piezoelectric polymer material and lower than the melting point Tm1, and at a compressive stress of from 5 MPa to 10,000 MPa, and wherein the piezoelectric polymer material has a longitudinal elastic modulus in a direction in which the drawing is carried out of from 2.0 GPa to 10.0 GPa.

<10> The piezoelectric polymer material according to <9>, wherein the piezoelectric polymer material has a principal surface area of 5 mm² or more.

<11> A piezoelectric element comprising a piezoelectric polymer material having at least two surfaces and electrodes provided on the at least two surfaces of the piezoelectric polymer material, wherein the piezoelectric polymer material is the piezoelectric polymer material according to any one of <1> to <10>.

<12> A process for producing a piezoelectric polymer material, the process comprising subjecting a piezoelectric polymer material comprising a helical chiral polymer having a weight average molecular weight of from 50,000 to 1,000,000 and having optical activity, to a drawing process, the drawing process being carried out at a temperature higher than the glass transition temperature Tg of the piezoelectric polymer material and lower than the highest melting point Tm1 derived from the helical chiral polymer among melting points of the piezoelectric polymer material obtained by differential scanning calorimetry and at a compressive stress of from 10 MPa to 10,000 MPa.

<13> The process for producing a piezoelectric polymer material according to <12>, the process comprising, prior to the drawing process, subjecting the piezoelectric polymer material to a preheating process in which the piezoelectric polymer material is heated at from 60° C. to 170° C. for from 1 minute to 60 minutes.

<14> The process for producing a piezoelectric polymer material according to <12> or <13>, the process comprising, after the drawing process, subjecting the piezoelectric polymer material to an annealing process.

Effect of the Invention

According to the present invention, it is possible to provide a piezoelectric polymer material that requires no poling process, exhibits a high piezoelectric constant $d_{14}$, and exhibits excellent transparency and elasticity; a piezoelectric element; and a process for producing a piezoelectric polymer material.

BRIEF DESCRIPTION OF DRAWINGS

FIG. 3 is a schematic view (side cross sectional view) showing an example of a solid phase drawing process portion of a solid phase drawing device.

FIG. 4 is a schematic view (side cross sectional view) showing an example of a solid phase drawing device employing a roll-to-roll system.

BEST MODE FOR CARRYING OUT THE INVENTION

Figure 1:
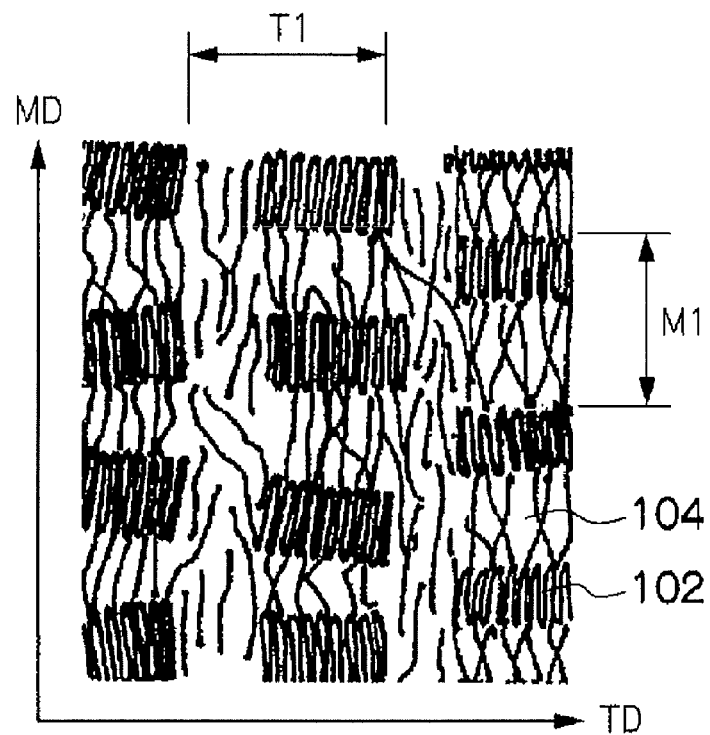
FIG. 1 is a schematic view showing the crystal structure of a piezoelectric polymer material having a low draw ratio in solid phase drawing.

Hereinafter, the present invention will be described with reference to embodiments.

<Piezoelectric Polymer Material>

A piezoelectric polymer material according to the present embodiment includes a helical chiral polymer having a weight average molecular weight of from 50,000 to 1,000,000 and having optical activity. Further, the piezoelectric polymer material has a piezoelectric constant $d_{14}$ at 25° C. of 10 pC/N or more, a degree of crystallinity obtained by X-ray diffraction of from 40% to 80%, and a haze of from 0.5 to 30.

By structuring the piezoelectric polymer material as described above, a piezoelectric polymer material that requires no poling process, exhibits a high piezoelectric constant $d_{14}$, and exhibits excellent transparency and elasticity can be achieved.

The term "piezoelectric constant $d_{14}$" refers to one of the piezoelectric modulus tensors. When a shearing stress is applied along the drawing axis direction of a drawn material, and when polarization occurs in a direction in which the shearing stress is applied, the density of charges generated per unit shearing stress is defined as $d_{14}$. The greater the value of the piezoelectric constant $d_{14}$ is, the higher the piezoelectricity is. The piezoelectric polymer material according to the present embodiment is required to have a piezoelectric constant $d_{14}$ of at least 10 pC/N or more, preferably 12 pC/N or more, and more preferably 15 pC/N or more. A higher piezoelectric constant $d_{14}$ is more preferable, but in order to keep the flexibility of a piezoelectric polymer material to be above a certain level, the piezoelectric constant is adjusted to be approximately 50 pC/N.

In the present embodiment, when simply mentioned as a "piezoelectric constant", it refers to "piezoelectric constant $d_{14}$".

In the present embodiment, the piezoelectric constant of the piezoelectric polymer material is a value obtained by measuring a 10 mm×3 mm test piece of the piezoelectric polymer material using RHEOLO-GRAPH SOLID S-1, manufactured by Toyo Seiki Seisaku-Sho, Ltd. Specifically, a shearing stress of from about 0.01 N/m² to 0.1 N/m² is applied to a test piece such that the highest shearing strain applied at room temperature at a frequency of 10 Hz is within the range of from 0.01% to 0.1%, and the real number part of the complex piezoelectric modulus $d_{14}$ of the test piece is measured.

Here, the complex piezoelectric modulus $d_{14}$ is calculated as $d_{14}=d_{14}'-id_{14}''$, wherein $d_{14}'$ and $id_{14}''$ can be obtained with the RHEOLO-GRAPH SOLID S-1, manufactured by Toyo Seiki Seisaku-Sho, Ltd. $d_{14}'$ represents the real number part of the complex piezoelectric modulus, and $id_{14}''$ represents the imaginary number part of the complex piezoelectric modulus. $d_{14}'$ (real number part of the complex piezoelectric modulus) corresponds to the piezoelectric constant $d_{14}$ in the present embodiment.

The higher the real number part of the complex piezoelectric modulus is, the more favorable the piezoelectricity is.

[Helical Chiral Polymer Having Optical Activity]

The helical chiral polymer having optical activity refers to a polymer having a spiral molecular structure and having molecular optical activity.

Examples of the helical chiral polymer having optically activity (hereinafter, also referred to as an "optically active polymer") include polypeptides, cellulose derivatives, polylactic acid-based resins, polypropylene oxides, and poly(β-hydroxy butyric acid).

Examples of the polypeptide include poly(γ-benzyl glutaric acid) and poly(γ-methyl glutaric acid).

Examples of the cellulose derivative include cellulose acetate and cyanoethyl cellulose.

The optically active polymer preferably has an optical purity of 99.00% ee or more, more preferably 99.50% ee or more, and still more preferably 99.99% ee or more, from the viewpoint of improving the piezoelectricity of the piezoelectric polymer material. The optical purity is desirably 100.00% ee. It is considered that by adjusting the optical purity of the optically active polymer to be in the range mentioned above, a packing property of polymer crystals that demonstrate piezoelectricity is increased, whereby the piezoelectricity is increased.

In the present embodiment, the optical purity of the optically active polymer is a value calculated by the following equation.

Optical purity (% ee)=100×|L isomer amount−D isomer amount|/(L isomer amount+D isomer amount)

More specifically, the optical purity is defined as a value obtained by dividing the difference (absolute value) between the L isomer amount (% by mass) of the optically active polymer and the D isomer amount (% by mass) of the optically active polymer by the total of the L isomer amount (% by mass) of the optically active polymer and the D isomer amount (% by mass) of the optically active polymer, and multiplying the quotient by 100.

For the L isomer amount [% by mass] of the optically active polymer and the D isomer amount [% by mass] of the optically active polymer, values obtained by a method using high performance liquid chromatography (HPLC) are used.

The specifics of the measurement will be described later.

Among the optically active polymers described above, a compound including a repeating unit represented by the following Formula (1) as a main chain is preferable from the viewpoint of increasing the optical purity and improving the piezoelectricity.

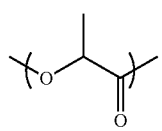

(1)

Examples of the compound containing a repeating unit represented by Formula (1) as a main chain include polylactic acid resins. Among these, polylactic acid is preferred, and a homopolymer of L-lactic acid (PLLA) or a homopolymer of D-lactic acid (PDLA) is most preferred.

The polylactic acid resin refers to any one of polylactic acid, a copolymer of L-lactic acid or D-lactic acid and a polyfunctional compound capable of being copolymerized with L-lactic acid or D-lactic acid, or a mixture thereof.

Polylactic acid is a polymer having a long chain structure formed by polymerization of lactic acid via ester bonding, and it is known that polylactic acid can be produced by a lactide method in which lactide is produced as an intermediate, a direct polymerization method including heating lactic acid in a solvent under a reduced pressure, and polymerizing the same while removing water, or the like. Examples of the polylactic acid include a homopolymer of L-lactic acid, a homopolymer of D-lactic acid, a block copolymer containing a polymer of at least one of L-lactic acid and D-lactic acid, and a graft copolymer containing a polymer of at least one of L-lactic acid and D-lactic acid.

Examples of the copolymerizable polyfunctional compound include hydroxycarboxylic acid, such as glycolic acid, dimethyl glycolic acid, 3-hydroxybutyric acid, 4-hydroxybutyric acid, 2-hydroxypropanoic acid, 3-hydroxypropanoic acid, 2-hydroxyvaleric acid, 3-hydroxyvaleric acid, 4-hydroxyvaleric acid, 5-hydroxyvaleric acid, 2-hydroxycaproic acid, 3-hydroxycaproic acid, 4-hydroxycaproic acid, 5-hydroxycaproic acid, 6-hydroxycaproic acid, 6-hydroxymethyl caproic acid, and mandelic acid; cyclic ester, such as glycolide, β-methyl-δ-valerolactone, γ-valerolactone, and ∈-caprolactone; polyvalent carboxylic acid, such as oxalic acid, malonic acid, succinic acid, glutaric acid, adipic acid, pimelic acid, azelaic acid, sebacic acid, undecanedioic acid, dodecanedioic acid, and terephthalic acid, and anhydrides thereof; polyhydric alcohol, such as ethylene glycol, diethylene glycol, triethylene glycol, 1,2-propanediol, 1,3-propanediol, 1,3-butanediol, 1,4-butanediol, 2,3-butanediol, 1,5-pentanediol, 1,6-hexanediol, 1,9-nonanediol, 3-methyl-1,5-pentanediol, neopentylglycol, tetramethyleneglycol, and 1,4-hexanedimethanol; polysaccharide, such as cellulose; and aminocarboxylic acid, such as α-amino acid.

Examples of the copolymer of lactic acid and a polyfunctional compound capable of being copolymerized with lactic acid include a block copolymer or a graft copolymer having a polylactic acid sequence capable of generating a spiral crystal.

The polylactic acid resin can be manufactured by, for example, a method disclosed in JP-A No. 59-096123 or 7-033861 in which a polylactic acid resin is obtained by performing direct dehydration condensation of lactic acid; a method disclosed in U.S. Pat. Nos. 2,668,182, 4,057,357, etc. in which ring opening polymerization is performed using lactide which is a cyclic dimer of lactic acid.

In order that the optically active polymer obtained by the manufacturing methods described above has an optical purity of 99.00% ee or more, when polylactic acid is produced by a lactide method, for example, it is preferable to polymerize lactide whose optical purity has been increased to an optical purity of 99.00% ee or more by crystallization operation.

The weight average molecular weight (Mw) of the optically active polymer according to the present embodiment is from 50,000 to 1,000,000.

When the lower limit of the weight average molecular weight of the optically active polymer is lower than 50,000, the mechanical strength of an article formed from the optically active polymer is insufficient. The lower limit of the weight average molecular weight of the optically active polymer is preferably 100,000 or more, and more preferably 200,000 or more. In contrast, when the upper limit of the weight average molecular weight of the optically active polymer exceeds 1,000,000, molding, such as extrusion molding, of an article such as a film formed from the optically active polymer cannot be performed. The upper limit of the weight average molecular weight is preferably 800,000 or lower, and more preferably 300,000 or lower.

The molecular weight distribution (Mw/Mn) of the optically active polymer is preferably from 1.1 to 5, and more preferably from 1.2 to 4, from the viewpoint of the strength or the degree of orientation of a drawn film. The molecular weight distribution is further preferably from 1.4 to 3.

When a polylactic acid resin is used as the optically active polymer, it is preferable to produce the optically active polymer by a lactide method or a direct polymerization method in order to obtain a polylactic acid resin having a weight average molecular weight (Mw) of 50,000 or more.

The piezoelectric polymer material of the present embodiment may contain other components, such as a known resin typified by polyethylene resin or polystyrene resin, inorganic compounds, such as silica, hydroxyapatite or montmorillonite, known crystal nucleating agents, such as phthalocyanine, in addition to the optically active polymer, insofar as the advantageous effect of the present embodiment is not impaired.

For example, in order to form a piezoelectric polymer material into a transparent film in which generation of voids, such as bubbles, is suppressed, inorganic fillers, such as hydroxy apatite, may be nano-dispersed into the piezoelectric polymer material. However, in order to allow an inorganic filler to be nano-dispersed, a large amount of energy is required for crushing aggregates. On the other hand, when the filler is not nano-dispersed, transparency of the film may decrease in some cases. When the piezoelectric polymer material according to the present embodiment contains an inorganic filler, the content thereof with respect to the total mass of the piezoelectric polymer material is preferably lower than 1% by mass.

When the piezoelectric polymer material of the present embodiment contains an optically active polymer having a high optical purity of 99.00% ee or more, a transparent film can be obtained without the need of nano-dispersing an inorganic filler such as hydroxyapatite. Further, from the viewpoint of improving the optical purity and the piezoelectric constant of an optically active polymer, the piezoelectric polymer material of the present embodiment preferably consists only of the optically active polymer.

When the piezoelectric polymer material according to the present embodiment contains a component other than the optically active polymer, the content thereof other than the optically active polymer is preferably 20% by mass or lower, and more preferably 10% by mass or lower, with respect to the total mass of the piezoelectric polymer material.

The present inventors have conducted extensive studies and, as a result, the present inventors have found that a piezoelectric polymer material having an even higher piezoelectricity can be produced by orienting molecular chains of an optically active polymer in a single direction with high density. More specifically, the optically active polymer contained in the piezoelectric polymer material is preferably in the form of a crystal with a high degree of crystallinity and a high degree of orientation.

The piezoelectric polymer material according to the present embodiment has a degree of crystallinity as measured by X-ray diffraction of from 40% to 80%. From the viewpoint of improving the piezoelectricity of the piezoelectric polymer material, the degree of crystallinity is preferably 50% or more, and more preferably 55% or more. In contrast, from the viewpoint of flexibility of a film, the upper limit of the degree of crystallinity is preferably 80%, and more preferably 70%.

Similarly, from the viewpoint of improving the piezoelectricity of the piezoelectric polymer material, the degree of orientation of the piezoelectric polymer material as measured by X-ray diffraction is preferably 0.90 or more, and more preferably 0.94 or more.

The degree of crystallinity and the degree of orientation of the optically active polymer can be confirmed by measuring the piezoelectric polymer material with an X-ray diffraction analyzer.

The details of the measurement method will be described later.

Despite a high degree of crystallinity as measured by X-ray diffraction of from 40% to 80%, the piezoelectric polymer material according to the present embodiment exhibits excellent transparency and a haze of from 0.5 to 30. The haze is a value obtained by measuring a 0.05 mm-thick piezoelectric polymer material with a haze meter (trade name: TC-HIII DPK, manufactured by Tokyo Denshoku CO., LTD.) and the details of the measurement method will be described later. The haze of the piezoelectric polymer material is preferably from 0.1 to 10, and more preferably from 0.1 to 5.

[Drawing Process]

The piezoelectric polymer material of the present embodiment is preferably formed into an article that has been subjected to a drawing process. The drawing method is not particularly limited and various drawing methods, such as uniaxial drawing, biaxial drawing, or solid phase drawing that will described later, can be used.

By drawing the piezoelectric polymer material, a piezoelectric polymer material having a large principal surface area can be obtained.

Here, the "principal surface" refers to a surface with the largest area among surfaces of the piezoelectric polymer material. The piezoelectric polymer material of the present embodiment may have two or more principal surfaces. For example, when the piezoelectric polymer material is a plate-like material having two surfaces A, each having a size of 10 mm×0.3 mm square; two surfaces B, each having a size of 3 mm×0.3 mm square; and two surfaces C, each having a size of 10 mm×3 mm square, the principal surface of the piezoelectric polymer material is surfaces C, i.e., the piezoelectric polymer material has two principal surfaces.

In the present embodiment, having a large principal surface area refers to having a principal surface area of 5 mm$^2$ or more, preferably 10 mm$^2$ or more.

The "solid phase drawing" refers to carrying out drawing at a temperature higher than the glass transition temperature Tg of a piezoelectric polymer material and lower than the highest melting point Tm1 derived from a helical chiral polymer among the melting points of the piezoelectric polymer material and at a compressive stress of from 5 MPa to 10,000 MPa. This is a preferable drawing method from the viewpoint of further improving the piezoelectricity, transparency and elasticity of the piezoelectric polymer material.

It is presumed that, by performing solid phase drawing of a piezoelectric polymer material, molecular chains of the optically active polymer contained in the piezoelectric polymer material of the present embodiment can be oriented in a single direction, and aligned with high density, whereby an even higher piezoelectricity can be achieved.

Here, the glass transition temperature Tg [° C.] of the piezoelectric polymer material and the melting point Tm of the piezoelectric polymer material [° C.] refer to a glass transition temperature (Tg), which is obtained as a point of inflection of a melting endothermic curve when the temperature of the piezoelectric polymer material is increased at a temperature elevation rate of 10° C./min using the differential scanning calorimetry (DSC) described above, and a temperature (Tm) confirmed as the peak value of endothermic reaction.

Even when the piezoelectric polymer material contains only one kind of helical chiral polymer, two or more peaks of endothermic reaction in the melting endothermic curve may be obtained depending on the material of the helical chiral polymer, the manner of drawing the piezoelectric polymer material (for example, when the draw ratio is high), or other factors. When the piezoelectric polymer material contains two or more kinds of helical chiral polymers, or contains another polymer in addition to the helical chiral polymer, it is possible that more endothermic peaks are obtained. The passage "the piezoelectric polymer material has two or more melting points as measured by differential scanning calorimetry" indicates that two or more peaks of endothermic reaction are obtained. With respect to the melting points of the piezoelectric polymer material according to the present embodiment, Tm1 and Tm3 refer to the highest melting point (Tm1) and the lowest melting point (Tm3), respectively, among the melting points derived from a helical chiral polymer among the temperatures (melting point) of the respective peak values when two or more peaks of endothermic reaction are obtained.

When only one peak of endothermic reaction is obtained in the piezoelectric polymer material according to the present embodiment, the temperature (Tm) at the peak is defined as the highest melting point Tm1 derived from a helical chiral polymer among the melting points of the piezoelectric polymer material.

In the invention, the terms "melting point Tm1 of a piezoelectric polymer material", "melting point Tm2 of a piezoelectric polymer material" and "melting point Tm3 of a piezoelectric polymer material", or simply as "Tm1", "Tm2" and "Tm3" refer to Tm1, Tm2, and Tm3 being a melting point derived from a helical chiral polymer.

When the piezoelectric polymer material is drawn only by a tensile force, such as uniaxial drawing or biaxial drawing, the drawing temperature of the piezoelectric polymer material is preferably higher than the glass transition temperature of the piezoelectric polymer material by about 10° C. to about 20° C. For example, when polylactic acid is used as the piezoelectric polymer material, the piezoelectric polymer material is preferably drawn at 60° C. to 80° C.

The drawing temperature of the piezoelectric polymer material during solid phase drawing is preferably higher than the glass transition temperature Tg of the piezoelectric polymer material and lower than the melting point Tm1 of the piezoelectric polymer material, more preferably within a range of Tms±20° C., and still more preferably within a range of Tms±10° C.

Here, the "Tms" refers to a temperature at a point of inflection derived from a helical chiral polymer among the points of inflection at which the piezoelectric polymer material prior to being subjected to solid phase drawing starts to melt, in the melting endothermic curve of the piezoelectric polymer material prior to being subjected to solid phase drawing. The melting endothermic curve of the piezoelectric polymer material prior to being subjected to solid phase drawing is a melting endothermic curve obtained when the temperature of the piezoelectric polymer material prior to being subjected to solid phase drawing is increased at a temperature elevation rate of 10° C./min using a differential scanning calorimeter (DSC), in a similar manner to the Tm measurement.

By setting the drawing temperature for solid phase drawing to be in a range described above, a large number of chain-like polymer crystals extending in a direction of orientation can be obtained without melting crystal lamellas being present in the piezoelectric polymer material.

When the piezoelectric polymer material is drawn at a temperature of Tm1 or more, polymer crystals in a resin of an optically active polymer may melt, and the degree of crystallinity and the degree of orientation of the optically active polymer may decrease, whereby the piezoelectric constant may decrease, which is not preferable.

The compressive stress is preferably from 50 MPa to 5000 MPa, and more preferably from 100 MPa to 3000 MPa.

In the present embodiment, when solid phase drawing is performed using a buret in a device such as a capirograph, the compressive stress refers to a value obtained by dividing the load (N) of a cylinder of a capirograph during solid phase drawing by the area (m²) of the outlet port of a die. When solid phase drawing is performed with rolls or the like, the compressive stress is a value obtained by dividing the load to be applied to the entire bearing of the roll by the area (m²) of the region to be rolled. The load applied to the bearing of the roll is measured by a load cell or the like, and the area of the region to be rolled is measured by a film sensor for pressure measurement (PRESCALE, manufactured by FUJIFILM Corporation) or the like, for example.

When the piezoelectric polymer material of the present embodiment is polylactic acid, Tm1 is preferably 160° C. or more and lower than 250° C., and more preferably 160° C. or more and lower than 220° C.

When the piezoelectric polymer material of the present embodiment is polylactic acid, a dense crystal state, which correlates with the expression of piezoelectricity, is ensured by setting Tm1 to be in the range mentioned above, and high piezoelectricity can be demonstrated.

In the solid phase drawing, the piezoelectric polymer material is preferably drawn and oriented in at least one direction parallel to a principal surface of the piezoelectric polymer material, while applying a compressive stress to the principal surface.

By performing solid phase drawing of the piezoelectric polymer material of the present embodiment, which includes an optically active polymer having a high optical purity, a piezoelectric polymer material having an even higher piezoelectricity can be produced.

The draw ratio in the drawing process is optimized to a ratio at which a large number of α crystals that exhibit high piezoelectricity are generated. The draw ratio may vary depending on the piezoelectric polymer material or the drawing method, and thus cannot be indiscriminately limited to a certain range. However, when a polylactic acid resin is used as the piezoelectric polymer material, a large number of α crystals are generated at a draw ratio of from about 3 to 30 times. More preferably, the drawing is carried out at a draw ratio of from 4 to 15 times.

Generation of α crystals can be measured from a diffraction profile in a meridian direction (MD method) obtained at an output of 40 kV and CuKα rays of 370 mA, using an X-ray diffraction diffractometer RINT2550, manufactured by Rigaku Corp. The α crystal (0010) reflection appears in the vicinity of a diffraction angle 2θ=32° and the β crystal (003) reflection appears in the vicinity of a diffraction angle 2θ=31°, which are lower than a peak derived from the α crystal.

From the peak intensity derived from the α crystal and the peak intensity derived from the β crystal obtained from the X ray diffraction measurement of the piezoelectric polymer material, the α crystal content is defined and calculated by the following equation.

$$\alpha \text{ crystal content} = I(0010)\alpha/[I(003)\beta + I(0010)\alpha] \quad (1)$$

In the equation, I(0010)α represents a peak intensity derived from the α crystal and I(003)β represents a peak intensity derived from the β crystal.

The α crystal content is preferably from 0.1 to 0.99, and more preferably from 0.15 to 0.99.

The product of the α crystal content obtained from X-ray diffraction measurement, the degree of crystallinity, and the degree of orientation is preferably 3.0 or more and lower than 100, more preferably 6.5 or more and lower than 100, still more preferably 7.0 or more and lower than 50, and particularly preferably 8.0 or more and lower than 20.

When the product of the α crystal content obtained from X-ray diffraction measurement, the degree of crystallinity, and the degree of orientation, which are three major factors that are considered to be positively correlated to an improvement of piezoelectricity, is within the range described above, an even higher piezoelectricity can be achieved.

In general, a film formed from a crystalline polymer, when it is not subjected to solid phase drawing, generates spherulites formed from crystalline lamellae by slowly cooling from a molten state. It is also possible to generate spherulites within a film by causing isothermal crystallization, by performing hot pressing or the like at a temperature arbitrarily set from the glass transition temperature Tg to the melting point Tm. During the process, by controlling the temperature for isothermal crystallization and the crystallization time, the type (α crystal, β crystal, γ crystal) of crystals constituting the lamellar crystal and the crystal content can be controlled. By increasing the crystal content of crystals that exhibit high piezoelectricity depending on each resin, the piezoelectricity of the entire film can be improved.

For example, when polylactic acid is used as a helical chiral polymer, the piezoelectric constant of a polymer material can be increased by increasing the proportion of the α crystals among the crystals constituting the lamellar crystal, by causing isothermal crystallization at around 110° C.

When the drawing process to be performed is a process in which drawing is performed only by a tensile force, such as uniaxial drawing or biaxial or drawing, the piezoelectric polymer material prior to be subjected to drawing desirably has a low degree of crystallinity with a proportion of amorphous portions being as high as possible.

For example, in order to produce a film with a high proportion of amorphous portions from polylactic acid, when a piezoelectric polymer material consisting only of polylactic acid is subjected to drawing process, such a film can be produced by rapidly cooling a film obtained by carrying out melt extrusion of the piezoelectric polymer material with a metal roll having a temperature of not more than the glass transition temperature Tg of the piezoelectric polymer material.

When drawing is carried out at a temperature higher than the glass transition temperature Tg of the piezoelectric polymer material and lower than the melting point Tm1 of the piezoelectric polymer material, and at a compressive stress of from 5 MPa to 10,000 MPa, i.e., when the film has not been subjected to solid phase drawing and the optically active polymer contained in the piezoelectric polymer material is a crystalline polymer, the film may fracture or whiten when drawing is carried out at high magnification while applying a compressive stress to the piezoelectric polymer material whose degree of crystallinity is low. Therefore, drawing is preferably performed while maintaining a high degree of crystallinity of the piezoelectric polymer material. As a method for achieving a high degree of crystallinity of a piezoelectric polymer material, the degree of crystallinity can be increased by heating for a given period of time at a temperature around Tc, which is a temperature of the exothermic peak associated with the crystallization obtained in differential scanning calorimetry (DSC) or the degree of crystallinity can be increased by melting a crystalline polymer by hot press or the like while applying a compressive stress, and then slowly cooling the crystalline polymer.

In general, the degree of crystallinity as measured by DSC of a piezoelectric polymer material before being drawn is preferably 50% or more, and more preferably 60% or more.

The drawing of the piezoelectric polymer material is carried out by nipping the piezoelectric polymer material with rolls or burets described later, and applying a pressure thereto. When burets are used for drawing the piezoelectric polymer material, the piezoelectric polymer material is preferably subjected to a preheating process before drawing, in which the piezoelectric polymer material is heated at a temperature of 60° C. to 170° C. for 1 minute to 60 minutes, before applying a pressure to the piezoelectric polymer material being nipped by the burets, i.e., before drawing.

The temperature of the preheating process before drawing is preferably from 100° C. to 160° C., and the preheating time is preferably from 5 minutes to 30 minutes.

From the viewpoint of increasing the piezoelectric constant, the piezoelectric polymer material after the drawing process is preferably subjected to a given heat process (hereinafter, also referred to as "annealing" or "annealing process").

The annealing temperature is generally preferably from 80° C. to 160° C., and more preferably from 100° C. to 155° C.

The method for applying temperature during annealing is not particularly limited. Examples include directly heating using a hot air heater or an infrared heater, or immersing a piezoelectric polymer material in a heated liquid, such as heated silicone oil.

When the piezoelectric polymer material is deformed due to linear expansion during annealing, it is difficult to obtain a film being flat in practical use. Therefore, it is preferable to apply a temperature while applying a given tensile stress (e.g., from 0.01 MPa to 100 MPa) to the piezoelectric polymer material so as not to loosen.

The annealing temperature application time is preferably from 1 second to 300 seconds, more preferably from 1 second to 60 seconds. When annealing is performed for over 300 seconds, spherulites may grow from molecular chains of an amorphous portion at a temperature higher than the glass transition temperature of the piezoelectric polymer material, whereby the degree of orientation may decrease. As a result, piezoelectricity may decrease.

The piezoelectric polymer material that has been annealed as described above is preferably rapidly cooled after the annealing process. In the annealing process, "rapidly cooling" refers to cooling the annealed piezoelectric polymer material by, for example, immersing the same in ice water or the like to cool down at least to a temperature equal to or lower than the glass transition point Tg, while performing no treatment between the annealing and the immersion.

Examples of the rapid cooling method include a method of immersing the annealed piezoelectric polymer material in a coolant such as water, ice water, ethanol, ethanol or methanol in which dry ice is placed, or liquid nitrogen; and a method of cooling the annealed piezoelectric polymer material via latent heat vaporization by spraying a liquid having a low steam pressure. In order to continuously cool the piezoelectric polymer material, the piezoelectric polymer material can be rapidly cooled by, for example, bringing the piezoelectric polymer material into contact with a metal roll whose temperature is controlled to be equal to or lower than the glass transition temperature Tg of the piezoelectric polymer material.

The number of times of cooling may be only one, or may be two or more. It is also possible to perform annealing and cooling alternately.

-Longitudinal Elastic Modulus-

When the piezoelectric polymer material of the present embodiment is polylactic acid, the longitudinal elastic modulus in a drawing direction in the drawing process is preferably from 2.0 GPa to 10.0 GPa, more preferably from 4.0 GPa to 10.0 GPa, and still more preferably from 4.5 GPa to 6 GPa.

When the longitudinal elastic modulus is in the range mentioned above, a high degree of crystallinity and a high degree of orientation, each of which correlating with the piezoelectric constant, can be secured, and a high degree of piezoelectricity can be achieved. By drawing the piezoelectric polymer material of the present embodiment by solid phase drawing, the temperature dependency of the elastic modulus of the piezoelectric polymer material can be made lower than that of a uniaxially drawn piezoelectric polymer material.

Here, the description "in the drawing process" refers to a state after completing the drawing process of various kinds, such as uniaxially drawing process or solid phase drawing process, of the piezoelectric polymer material, and after performing annealing and rapid cooling.

The details of the method for measuring the longitudinal elastic modulus in a drawing direction in the drawing process will be described later.

The piezoelectric polymer material according to the present embodiment is preferably a piezoelectric polymer material (piezoelectric polymer material P1) having a continuous structure of a low crystal phase and a high crystal phase with a structure cycle of 12.5 inn to 80.0 nm (continuous structure A) in a direction almost parallel with the screw axis of the spiral structure of the helical chiral polymer, but not substantially having the continuous structure A in a direction almost parallel with one direction orthogonal to the screw axis.

The crystal structure of the piezoelectric polymer material P1 will be explained with reference to FIGS. 1 and 2.

FIG. 1 is a schematic view showing a crystal structure of the piezoelectric polymer material according to the present embodiment that has been drawn by solid phase drawing at a low draw ratio (e.g., 4 times). FIG. 2 is a schematic view showing a crystal structure of the piezoelectric polymer material according to the present embodiment that has been drawn by solid phase drawing at a high draw ratio (e.g., 10 times). It is considered that the crystal structure of the piezoelectric polymer material P1 has a crystal structure shown in FIG. 2.

Figure 2:
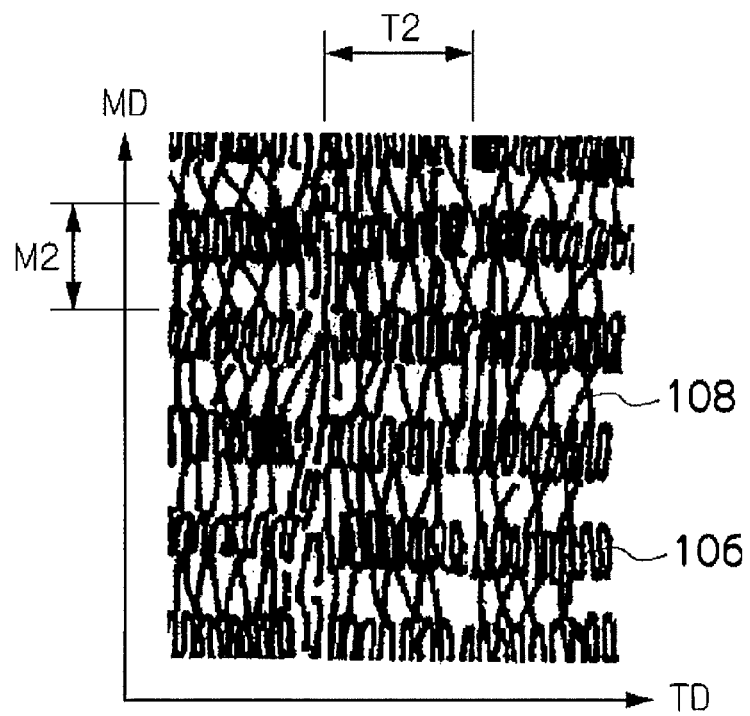
FIG. 2 is a schematic view showing the crystal structure of a piezoelectric polymer material having a high draw ratio in solid phase drawing.

In FIGS. 1 and 2, MD represents a drawing direction (Machine Direction) of the piezoelectric polymer material, and TD represents a direction orthogonal to the MD direction. (Trans-Verse Direction)

FIG. 1 shows high crystal phases 102 and low crystal phases 104. FIG. 2 shows high crystal phases 106 and low crystal phases 108. The high crystal phase is a region in which the proportion of crystal portions is higher than the proportion of amorphous portions and, for example, contains a lamellar crystal or the like. The low crystal phase is a region in which the proportion of amorphous portions is higher than the proportion of crystal portions.

In solid phase drawing, the piezoelectric polymer material is drawn in a direction almost parallel with the screw axis of the spiral structure of the helical chiral polymer. As shown in FIGS. 1 and 2, whether the draw ratio is low or high, it is considered that the low crystal phases 104 and the high crystal phases 102, or the low crystal phases 106 and the high crystal phases 108, are positioned in line along the drawing direction (MD direction) of the piezoelectric polymer material, thereby forming a continuous structure of the low crystal phases 104 and the high crystal phases 102, or a continuous structure of the low crystal phases 106 and the high crystal phases 108.

However, the structure cycle (periodic interval) T2 of the continuous structure formed of the low crystal phases 106 and the high crystal phases 108 at a high draw ratio tends to be shorter than the structure cycle T1 of the continuous structure formed of the low crystal phases 102 and the high crystal phases 104 at a low draw ratio. Specifically, the structure cycle T2 of the continuous structure (continuous structure A) formed of the low crystal phases 106 and the high crystal phases 108 is from 12.5 nm to 80.0 nm.

In contrast, in a direction orthogonal to a drawing direction (MD direction) of the piezoelectric polymer material (TD direction), i.e., in a direction almost parallel with one direction orthogonal to the screw axis, when the draw ratio of the piezoelectric polymer material is low, the continuous structure formed of the low crystal phases 104 and the high crystal phases 102 is formed, as is the case with in the MD direction.

However, as the draw ratio of the piezoelectric polymer material increases, the low crystal phase forms a narrower low crystal phase 108. As a result, the low crystal phases 106 and the high crystal phases 108 do not substantially have the continuous structure A when the draw ratio of the piezoelectric polymer material is high.

The piezoelectric polymer material according to the present embodiment exhibits excellent elasticity in a drawing direction (MD direction). This is considered to be because the high crystal phases 108 are densely aligned in the TD direction, but are aligned at intervals in the MD direction.

The changes in the crystal structure shown in FIGS. 1 and 2 are supported by Small Angle X-ray Scattering (hereinafter, also referred to as "SAXS"). Various analysis methods may be used for SAXS measurement, but in the present embodiment, analysis was performed using a SAXS curve [longitudinal axis: I (q), horizontal axis: q] in which the intensity I(q) at the scattering vector q is plotted, the scattering vector q having a relationship "$\lambda q = 4\pi \sin \theta$" between the wavelength $\lambda$[nm] and the scattering angle 2θ [rad] of the X rays used in the SAXS measurement.

In the present invention, the SAXS measurement was carried out by a small angle/wide angle scattering experiment beamline BL40B2, installed at a large synchrotron radiation facility SPring-8 (in Hyogo prefecture). However, similar measurements can be performed with a device available from Rigaku Corporation.

The details of the SAXS measurement method (conditions) will be described later.

When the piezoelectric polymer material P1 described as a preferable embodiment of the piezoelectric polymer material according to the present embodiment, i.e., a piezoelectric polymer material having a continuous structure of low crystal phases and high crystal phases with a structure cycle of 12.5 nm to 80.0 nm (continuous structure A) in a direction almost parallel with the screw axis of the spiral structure of the helical chiral polymer but not substantially having the continuous structure A in a direction almost parallel with one direction orthogonal to the screw axis, it can be expressed as follows from the viewpoint of SAXS (Small Angle X-ray Scattering) measurement.

More specifically, the piezoelectric polymer material according to the present embodiment is preferably a piezoelectric polymer material (piezoelectric polymer material P1') showing a peak in a direction almost parallel with the screw axis of the spiral structure of the helical chiral polymer, but showing no peak in a direction almost parallel with one direction orthogonal to the screw axis, in a range where q is 0.05 to 0.0078 in a Small Angle X-ray Scattering curve [longitudinal axis: I(q), horizontal axis: q] obtained by plotting the intensity I(q) at the scattering vector q, the scattering vector q having a relationship of $\lambda q = 4\pi \sin \theta$ between the wavelength $\lambda$, [mm] and the scattering angle 2θ[rad] of the X rays from the Small Angle X-ray Scattering measurement using X rays having a wavelength of 0.1 nm (1 Å), and smoothing by a known method (moving average method).

The peak does not include noise that occurs when the intensity I(q) at the scattering vector q is plotted with respect to the scattering vector q. Specifically, the noise refers to a convex shape formed with a small number (such as two to five) of plot points (measurement points).

-Melting Point Properties-

The piezoelectric polymer material of the present embodiment thus obtained preferably has the following melting point property: that is, when the melting point of a piezoelectric polymer material, which is obtained by heating a piezoelectric polymer material having a melting point defined as Tm1, to a temperature of Tm1+15° C., and subsequently melting for 5 minutes and cooling to 0° C. at −10° C./min, is defined as Tm2, the difference between Tm1 and Tm2 is 2° C. to 10° C. The difference between Tm1 and Tm2 is more preferably 3° C. to 10° C., and still more preferably 4° C. to 10° C.

Specifically, the heating of the piezoelectric polymer material whose melting point is Tm1 is carried out by elevating the temperature of the piezoelectric polymer material of the present embodiment from room temperature (e.g., 20° C.) to Tm1+15° C. (hereinafter, also referred to as $T_A$) at 10° C. per minute (+10° C./min). In this process, the highest melting point among melting points obtained by differential scanning calorimetry temperature is defined as the melting point Tm1. The melting point obtained by differential scanning calorimetry refers to a temperature at a peak of a melting endothermic curve obtained by a differential scanning calorimeter (DSC-1, manufactured by PerkinElmer, Inc.).

When there is only one peak in the melting endothermic curve, the temperature at the peak is Tm1, as previously described.

Specifically, the cooling from the temperature $T_A$ is carried out by allowing the piezoelectric polymer material that has been heated to the temperature $T_A$ to stand at the temperature $T_A$ for 5 minutes, and subsequently lowering the temperature to 0° C. at 10° C. per minute (−10° C./min). Further, after cooling the piezoelectric polymer material, the temperature is raised to $T_A$ by heating at 10° C. per minute (+10° C./min). The peak temperature of the melting endothermic curve obtained by a differential scanning calorimeter (DSC-1, manufactured by PerkinElmer, Inc.) is defined as Tm2.

When the piezoelectric polymer material according to the present embodiment has two or more melting points, i.e., there are two or more peaks in a melting endothermic curve obtained by differential scanning calorimetry, the difference between the lowest melting point Tm3 and Tm1 is preferably within 30° C. When the difference between Tm1 and Tm3 is within 30° C., reduction in size of the high crystal phase of the piezoelectric polymer material is considered to be less likely to occur.

The difference between Tm1 and Tm3 is more preferably 3° C. to 30° C.

The solid phase drawing process carried out when piezoelectric polymer materials are mass-produced will be described.

First, as an overview of the process, the solid phase drawing process for mass production includes heating a melt-extruded film of the piezoelectric polymer material to increase its degree of crystallinity, prior to subjecting the same to rolling. Subsequently, the piezoelectric polymer material film is heated (preheated) to a temperature higher than the glass transition temperature Tg of the piezoelectric polymer material and lower than the melting point Tm1 of the piezoelectric polymer material, and then allowing the piezoelectric polymer material film to pass between a pair of heated rolls. Furthermore, the film after being subjected to rolling is annealed, and then rapidly cooled, thereby completing the solid phase drawing process.

Next, an example of the solid phase drawing process for mass production of the piezoelectric polymer material according to the present embodiment will be described with reference to FIGS. 3 and 4.

First, the draw ratio (rolling magnification) of the piezoelectric polymer material will be described.

FIG. 3 is a schematic view (side cross sectional view) showing an example of a solid phase drawing process portion of a solid phase drawing device. FIG. 3 includes a piezoelectric polymer material film 52, a pair of hot rolls 54 for rolling a piezoelectric polymer material film, and preheating portions 56 for warming a piezoelectric polymer material film before carrying out rolling. The hot roll pair 54 include a roll 54a and a roll 54b. The roll 54a rotates counterclockwise (direction indicated by the arrow q) and the roll 54b rotates clockwise (direction indicated by the arrow r). The number of rotations of the rolls 54a and 54b may be the same, or may be different from each other so that a shearing stress is applied to a film to further improve the degree of orientation and the piezoelectricity.

The temperature of the hot roll pair 54 and the preheating portions 56 is set to a temperature at which a piezoelectric polymer material film can be heated to a temperature higher than the glass transition temperature Tg of a piezoelectric polymer material and lower than the melting point Tm1 of a piezoelectric polymer material.

The piezoelectric polymer material film 52 is conveyed in a direction P in which the film moves, warmed at the preheating portions 56, and a piezoelectric polymer material film before rolling 52a turns to a piezoelectric polymer material film after rolling 52b at a portion between the hot roll pair 54. The rolling magnification of the piezoelectric polymer material film is roughly determined based on the ratio of a film thickness F of the piezoelectric polymer material film 52a before rolling and the interval f between the hot roll pair 54. For example, when a piezoelectric polymer material film whose thickness before the drawing is 600 μm (F=600 μm) is passed between the rolls positioned at an interval of 100 μm (f=100 μm), solid phase drawing can be performed at 6 times.

In order to increase the productivity of the piezoelectric polymer material, plural rolls may be arranged so as to perform multistage rolling.

Next, the entire structure of the solid phase drawing process for mass production will be described.

FIG. 4 is a schematic view (side cross sectional view) showing an example of a solid phase drawing device employing a roll-to-roll system. The solid phase drawing device shown in FIG. 4 employs a system in which a piezoelectric polymer material film is drawn (rolled) in two stages, and is subsequently annealed and rapidly cooled.

The piezoelectric polymer material film is stretched and tensioned by an unwinding portion 62 that rotates counterclockwise (direction indicated by the arrow s) to store the piezoelectric polymer material film, a winding portion 64 that rotates counterclockwise (direction indicated by the arrow t) to wind and collect the piezoelectric polymer material film after the rolling, a tension roll 66, and a cooling roll 68. Although not illustrated in FIG. 4, the piezoelectric polymer material film moves along a solid line that connects the unwinding portion 62 and the winding portion 64, during drawing.

The piezoelectric polymer material film that has been unwound from the unwinding portion 62 is rolled by a first hot roll portion including preheating portions 72 and heat and pressure application rolls 82, and subsequently rolled by a second hot roll including preheating portions 74 and heat and pressure application rolls 84. The piezoelectric polymer material film that has been subjected to the two-stage rolling is heated to 80° C. to 160° C. by anneal heat portions 76 after passing through the rolls 90 (annealing process). The piezoelectric polymer material film that has been heated at the anneal heat portions 76 is rapidly cooled by contacting a cooling roll 68. The surface of the cooling roll 68 is cooled by providing water-cooling piping or the like.

The piezoelectric polymer material film that has been cooled by the cooling roll 68 is wound around the winding portion 64, thereby completing the solid phase drawing process.

It is also a preferred embodiment in which the solid phase drawing device has an anti-meandering device, a film tension control device, or the like, which is not illustrated.

As described above, the piezoelectric polymer material of the present embodiment has a high piezoelectric constant $d_{14}$, excellent transparency and elasticity, and a large principal surface area. Therefore, the piezoelectric polymer material of the present embodiment can be utilized in various fields including speakers, headphones, microphones, underwater microphones, ultrasonic wave transducers, ultrasonic wave applied measuring instruments, piezoelectric vibrators, mechanical filters, piezoelectric transformers, delay devices, sensors, acceleration sensors, impact sensors, vibration sensors, pressure-sensitive sensors, tactile sensors, electric field sensors, sound pressure sensors, displays, fans, pumps, variable focus mirrors, noise insulating materials, sound insulating materials, keyboards, audio devices, information process machines, measurement apparatuses, medical apparatuses, and the like.

In such cases, the piezoelectric polymer material of the present embodiment is preferably used as a piezoelectric element having at least two surfaces on which an electrode is provided, respectively. It is sufficient when electrodes are provided on at least two surfaces of the piezoelectric polymer material. The electrodes are not particularly limited, and, for example, ITO, ZnO, IZO (registered trademark) or a conductive polymer may be used.

In particular, when an electrode is provided on a principal surface of the piezoelectric polymer material, the electrode is preferably transparent. A transparent electrode herein refers to an electrode having a haze of 20 or lower (total light transmittance is 80% or more).

The piezoelectric element employing the piezoelectric polymer material of the present embodiment is applicable to various kinds of piezoelectric devices as mentioned above, such as speakers and touch panels. In particular, the piezoelectric element having a transparent electrode is suitable for speakers, touch panels, actuators and the like.

EXAMPLES

Hereinafter, the present embodiment will be more specifically described with reference to Examples. However, the invention is not limited by the Examples.

Example 1

<Production of Uniaxially Oriented Film>
-Production of Film Before Drawing A11-

Approximately 4 g of pellets of a resin having optical activity (polylactic acid manufactured by PURAC, registered trademark: PURASORB PD, molecular weight Mw: 600,000, melting point (Tm1): 191° C., Tg: 60° C., Tms: 164° C.) was weighed and sandwiched between two SUS plates having a size of 250 mm square and a thickness of 5 mm, via a spacer made of an aluminum plate having a size of 250 mm square and a thickness of 0.15 mm, and having a disk-shaped hole with a diameter of 150 mm. This was held at 5 MPa for 3 minutes with a hot plate with a temperature set to 230° C., using a hot press manufactured by Toyo Seiki Seisaku-Sho, Ltd. (trademark: MINI TEST PRESS) (the process above is referred to as a hot press process.)

After the hot press process, the temperature was rapidly lowered to room temperature with an air cooling fan while applying a pressure, thereby obtaining a disk-shaped film before drawing A11 having a diameter of 150 mm and a thickness of 150 μm.

The specific means for obtaining the disk-shaped sheet of polylactic acid will be described with reference to the drawings.

Figure 5:
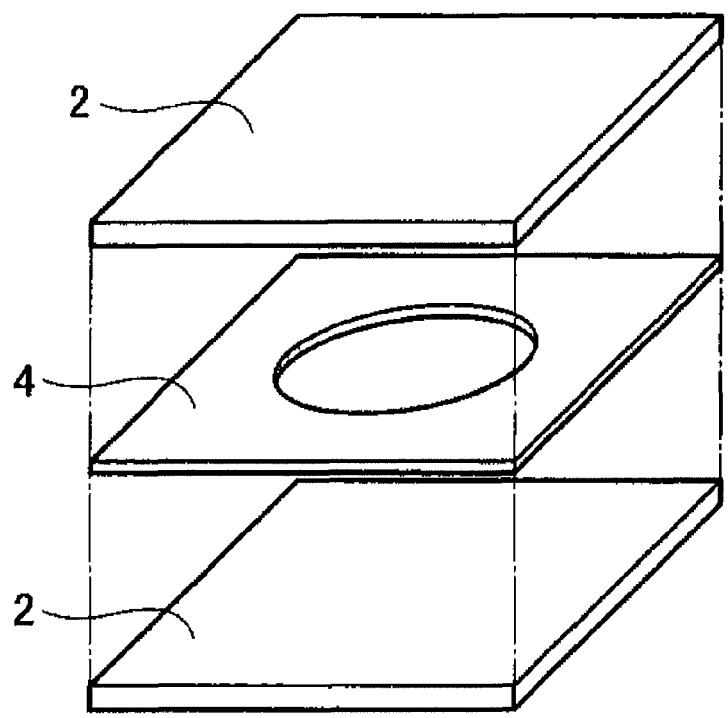
FIG. 5 is a schematic view (perspective diagram) showing an example of a hot press treatment performed in Example 1.
Figure 6:
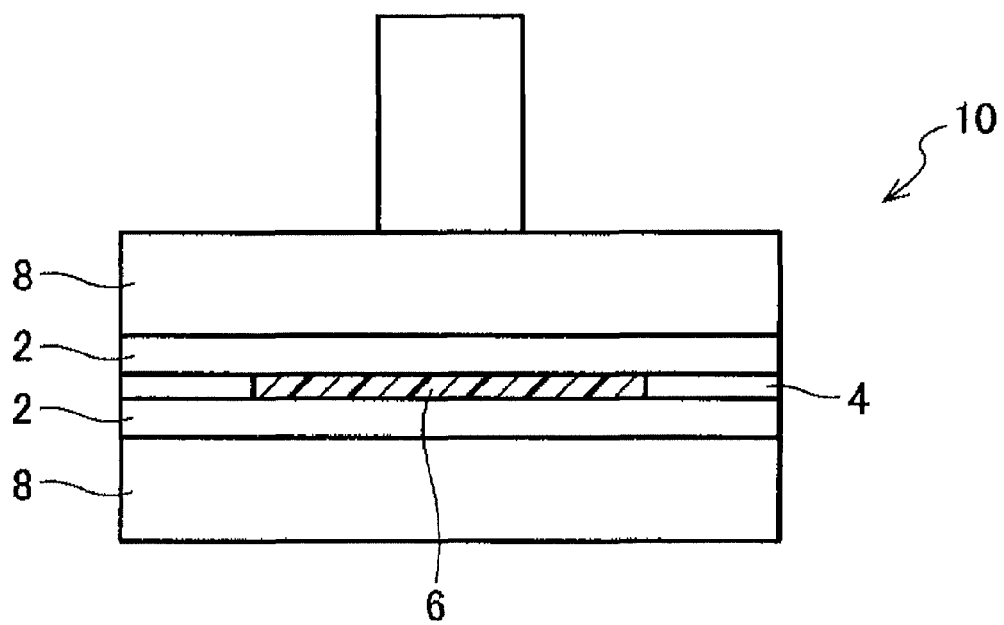
FIG. 6 is a schematic view (side cross sectional view) showing an example of a hot press machine used in Example 1.

FIG. 5 shows a schematic view (perspective view) of the hot press process in which a spacer 4 is sandwiched between two SUS plates 2. FIG. 6 shows a schematic view (side cross sectional view) of a heat and pressure application device (hot press machine) 10 that presses a pellet 6 of polylactic acid sandwiched between the two SUS plates 2 with hot plates.

In FIG. 5, the spacer 4 is a 250 mm-square aluminum plate having a thickness of 0.15 mm and a disk-shaped hole having a diameter of 150 mm formed in the center. The SUS plates 2 are 250 mm-square stainless steel plates having a thickness of 5 mm.

The pellet 6 of polylactic acid was placed in the disk-shaped hole of the spacer 4, and was sandwiched between the two SUS plates 2.

As shown in FIG. 6, the two SUS plates 2, the spacer 4 and the pellet 6 of polylactic acid were further sandwiched between two hot plates 8, and a pressure was applied thereto with the hot press machine 10.

-Uniaxial Drawing-

Next, in order to carry out uniaxial drawing, a rectangular film A12 having a width of 100 mm and a length of 50 mm was cut out from the hot-pressed film before drawing A11.

The cut-out film was set in a polymer film biaxially drawing device SS-60 manufactured by Shibayama Scientific Co., Ltd. Both ends of a 100 mm-long side of the film A12 were fixed only with uniaxial drawing chuck, at a portion 1 cm from the ends, such that the film before drawing substantially had a width of 100 mm and a length of 30 mm. The temperature inside the device was set to 70° C. Thereafter, drawing operation was started immediately after the temperature inside the drawing device and the film surface temperature reached 70° C.

The drawing of the film A12 was performed at a temperature inside the drawing device of 70° C., a draw ratio of 6 times, and a drawing rate of 30 mm/min.

Thus, a film A13 having a width of 50 mm, a length of 180 mm, a thickness of 0.05 mm, an area of 7200 mm$^2$, and a draw ratio of 6 times was obtained.

-Annealing Process-

Next, in order to carry out the annealing process of the film A13, the temperature inside the device was set to 150° C. and maintained at 150° C. for 15 seconds after the temperature reached 150° C., while chucking the film A13 to be fixed to the device. Thereafter, the film was sprayed with a 134aQREI spray (cooling spray) manufactured by Sunhayato Corp., and the temperature was cooled to a temperature equal to or lower than the glass transition point.

A piezoelectric polymer material 1 of Example 1 was thus prepared.

Example 2

<Production of Solid Phase Drawn Film>
-Production of film before drawing A21-

Hot pressing was performed in the same manner as in the production of the film before drawing A11, except that the spacer was changed to a 250 mm-square aluminum plate spacer having a thickness of 0.6 mm and a disk-shaped hole having a diameter of 150 mm, and that the temperature of the hot plate was changed to 205° C. After the heat process, the temperature of the hot press machine was set to room temperature of 25° C., and the temperature was slowly lowered to room temperature while applying a pressure to perform compression melt molding. A sheet before drawing A21 having a diameter of 150 mm and a thickness of 600 μm was thus obtained.

-Solid Phase Drawing-

Next, in order to carry out solid phase drawing, a rectangular film A22 having a width of 7 mm and a length of 35 mm was cut out from the hot-pressed film before drawing A21.

The cut-out film A22 was sandwiched by a pair of burets formed of methyl pentene polymer (trademark: TPX, manufactured by Mitsui Chemicals, Inc.), and drawing was carried out using a capirograph manufactured by Toyo Seiki Seisaku-Sho, Ltd.

The specific means for carrying out solid phase drawing will be described with reference to the drawings.

Figure 7A:
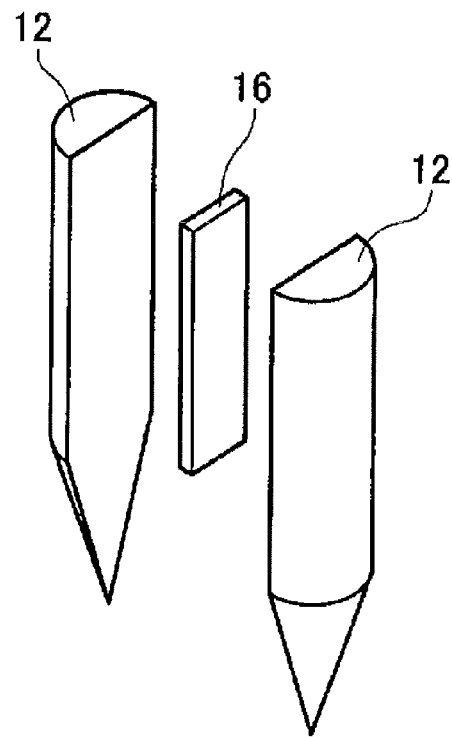
FIG. 7A is a schematic view (perspective diagram) showing an example of a solid phase drawing operation in Example 2.
Figure 7B:
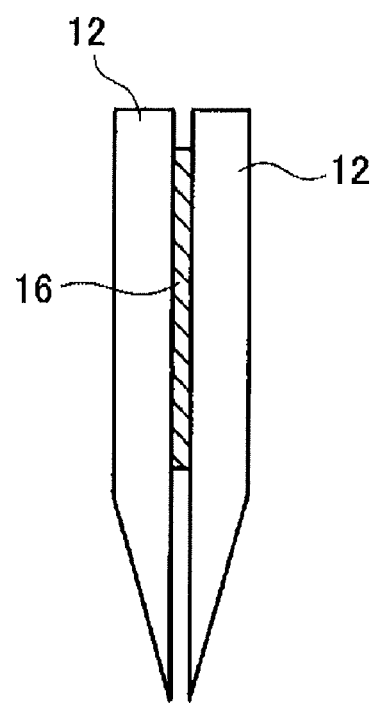
FIG. 7B is a schematic view (side cross sectional view) showing an example of a solid phase drawing used in Example 2.
Figure 8:
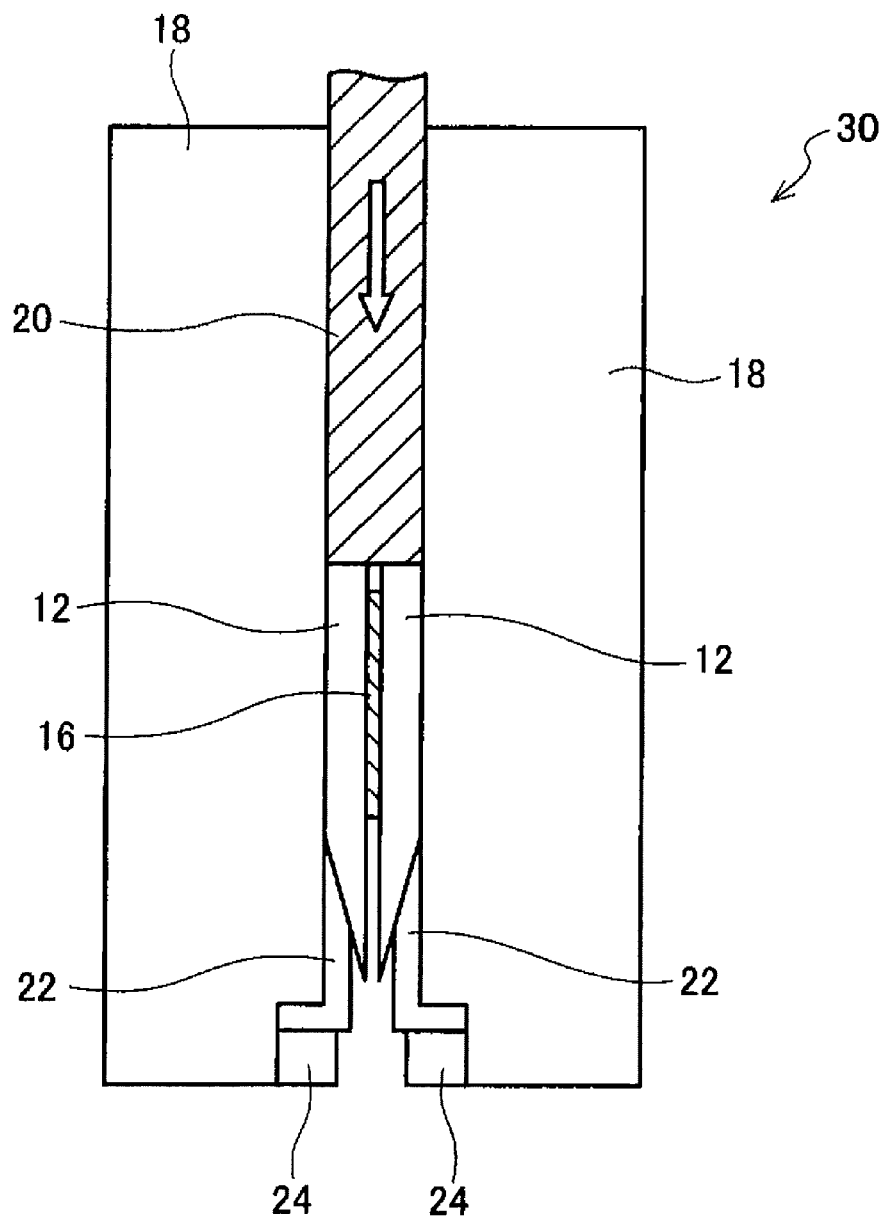
FIG. 8 is a schematic view (side cross sectional view) showing an example of a solid phase drawing device used in Example 2.

FIG. 7A represents a schematic view (perspective view) showing the order of sandwiching the rectangular film with the pair of burets. FIG. 7B represents a schematic view (side cross sectional view) showing a state in which the rectangular film was sandwiched by the pair of burets. FIG. 8 represents a schematic view (side cross sectional view) showing a state in which the pair of burets sandwiching the rectangular film is set in a heat and pressure application device (solid phase drawing device).

FIGS. 7A and 7B show burets 12 having a shape in which a cylinder, one end of which having a conical shape, is cut in half in a longitudinal direction of the cylinder and a rectangular film 16. In Example 2, as shown in FIGS. 7A and 7B, the rectangular film 16 (film A22) was placed in such a manner that the principal surface of the film 16 and the flat surfaces of burets 12 face each other, and the film 16 was sandwiched by the pair of burets 12.

FIG. 8 shows the pair of burets 12 sandwiching the film 16 (film A22) and a heat and pressure application device (solid phase drawing device) 30 that sandwiches the pair of burets while applying pressure thereto. The heat and pressure application device 30 has a pair of heater blocks 18 each having a semi-cylindrical groove, a cylinder 20 for extruding the film 16 between the pair of burets 12 sandwiched by the heater blocks 18 in a direction indicated by the arrow, a die 22 that holds the pair of burets 12, and a die setscrew 24.

By setting the pair of burets 12 sandwiching the film 16 (film A22) in the heat and pressure application device 30 such that one end of the conical shape is directed downward, and then heat and pressure were applied to allow the film 16 (film A22) to be drawn downward.

The drawing conditions for solid phase drawing were a setting temperature of 160° C., a draw ratio of 6 times, and a cylinder rate of 2 mm/min. The compressive stress was 200 MPa.

A film A23 obtained by solid phase drawing was a film having a width of 3 mm, a length of 180 mm, a thickness of 0.3 mm, and an area of 540 mm$^2$, which was drawn 6 times in a longitudinal length direction.

-Annealing Process-

Next, in order to carry out annealing, the thus obtained film A23 was immersed in an oil bath filled with 150° C. silicone oil for 15 seconds while applying a tension to the ends of the film both in a vertical direction and a longitudinal direction. Immediately after the 15-second immersion, the film was rapidly cooled by immersing in ice water.

A piezoelectric polymer material 2 of Example 2 was thus prepared.

Examples 3 to 16

Piezoelectric polymer materials 3 to 16 of Examples 3 to 16 were produced in the same manner as in Example 2, except that pellets of polylactic acid shown in Table 1 were used in place of the resin used in Example 2, and the drawing conditions were changed to that shown in Table 1.

Example 17 and Comparative Example 1

A piezoelectric polymer material 17 of Example 17 and a piezoelectric polymer material 101 of Comparative Example 1 were produced in the same manner as in Example 1, except that pellets of polylactic acid shown in Table 1 were used in place of the resin used in Example 1.

The following are materials used as the resin (polylactic acid) indicated as "PL" in Table 1.

Product name: PURASORB PL65, manufactured by PURAC, molecular weight Mw: 650,000, Tm1: 191° C., Tg: 61° C., Tms: 167° C.

Product name: PURASORB PL32, manufactured by PURAC, molecular weight Mw: 320,000, Tm1: 195° C., Tg: 60° C., Tms: 167° C.

Product name: PURASORB PL18, manufactured by PURAC, molecular weight Mw: 180,000, Tm1: 192° C., Tg: 61° C., Tms: 168° C.

The following material was used as the resin (polylactic acid) indicated as "PD" in Table 1.

Product name: PURASORB PD, manufactured by PURAC, molecular weight Mw: 600,000, Tm1: 191° C., Tg: 60° C., Tms: 164° C.

The following material was used as the resin (polylactic acid) indicated as "LA" in Table 1.

Product name: LACEA (H-100), manufactured by Mitsui Chemicals, Inc., molecular weight Mw: 150,000, Tm1: 176° C., Tg: 59° C., Tms: 160° C.

The optical purity and the molecular weight distribution (Mw/Mn) of the resin (optically active polymer) contained in the piezoelectric polymer material, and the glass transition temperature Tg, the melting point Tm1, the piezoelectric constant, the degree of crystallinity, the degree of orientation, and the longitudinal elastic modulus of the piezoelectric polymer materials 1 to 17 obtained in the Examples and the piezoelectric polymer material 101 obtained in the Comparative Example were measured. The results are shown in Tables 1 and 2.

Further, the haze of the piezoelectric polymer materials obtained in Examples 1 to 17 was measured. The results are shown in Table 2.

Specifically, the measurement was performed as follows.

<Optical Purity>

The amount of L isomer and the amount of D isomer of the resin (optically active polymer) contained in each of the piezoelectric polymer materials obtained in the Examples and the Comparative Example were measured by a method employing HPLC as described below, and the optical purity was calculated by the following equation. The results are shown in Table 1.

Optical purity (% ee)=100×|L isomer amount−D isomer amount|/(L isomer amount+D isomer amount).

-Measurement of L Isomer Amount and D Isomer Amount of Resin (Optically Active Polymer)-

1.0 g of a sample (piezoelectric polymer material 1) was weighed and charged in a 50-mL Erlenmeyer flask, and then 2.5 mL of IPA (isopropyl alcohol) and 5 mL of 5.0 mol/L sodium hydroxide solution were added.

The Erlenmeyer flask containing the sample solution was placed in a water bath at a temperature of 40° C., and then stirred for about 5 hours until the polylactic acid was completely hydrolyzed.

After cooling the sample solution to room temperature, 20 mL of 1.0 mol/L hydrochloric acid solution was added for neutralization, and the Erlenmeyer flask was tightly sealed and stirred. 1.0 mL of the sample solution was transferred to a 25-mL measuring flask, and an HPLC sample solution 1 was prepared in a mobile phase at 25 mL.

5 μL of the HPLC sample solution 1 was poured in an HPLC device, and the D/L isomer peak area of polylactic acid was determined under the following HPLC conditions, and the L isomer amount and the D isomer amount were calculated.

-HPLC Measurement Conditions-

Column: optical resolution column, SUMICHIRAL OA5000, manufactured by Sumika Chemical Analysis Service, Ltd.

Measuring device: liquid chromatography, manufactured by Nippon Bunko Co., Ltd

Column temperature: 25° C.

Mobile phase: 1.0 mM-copper sulfate (II) buffer solution/IPA=98/2 (V/V) copper sulfate (II)/1 PA/water=156.4 mg/20 mL/980 mL Mobile phase flow rate: 1.0 ml/min Detector: ultraviolet ray detector (UV 254 nm)

<Molecular Weight Distribution>

The molecular weight distribution (Mw/Mn) of the resin (optically active polymer) contained in each piezoelectric polymer material of the Examples and the Comparative Example was measured by the following GPC measurement method.

-GPC Measurement Method-

Measuring device: GPC-100, manufactured by Waters

Column: SHODEX LF-804, manufactured by Showa Denko K. K

Preparation of sample: each of the piezoelectric polymer materials of the Examples and the Comparative Example was dissolved in a solvent [chloroform] at 40° C., thereby preparing a sample solution with a concentration of 1 mg/ml.

Measurement conditions: 0.1 ml of the sample solution was introduced into a column with a solvent (chloroform) at a temperature of 40° C. at a flow rate of 1 ml/min, and the sample concentration in the sample solution separated in the column was measured with a differential refractometer. The molecular weight of the resin was determined by creating a universal calibration curve with a polystyrene standard sample, and calculating the weight average molecular weight (Mw) of each resin.

The results are shown in Table 1.

<Glass Transition Temperature Tg and Melting Point Tm1>

10 mg of each piezoelectric polymer material of the Examples and the Comparative Example was accurately weighed, and a melting endothermic curve was obtained therefrom by measuring under the conditions of a temperature elevation rate of 10° C./min with a differential scanning calorimeter (DSC-1, manufactured by PerkinElmer, Inc.) Among the endothermic peaks as measured in the obtained melting endothermic curve, the temperature of a peak positioned at the highest temperature (peak temperature) was defined as the melting point Tm1. Since the piezoelectric polymer materials of the Examples and the Comparative Example are formed of a helical chiral polymer, the endothermic peaks obtained from the melting endothermic curve of the piezoelectric polymer materials of the Examples and the Comparative Example are an endothermic peak derived from the helical chiral polymer.

The glass transition temperature Tg was measured under the conditions of a temperature elevation rate of 10° C./min from the melting endothermic curve with a differential scanning calorimeter (DSC-1, manufactured by PerkinElmer, Inc.) The temperature Tms, which is at a point of inflection derived from the helical chiral polymer among points of inflection at which the piezoelectric polymer material before being subjected to solid phase drawing starts to melt, was determined under the same conditions as in Tg.

The results are shown in Table 2.

<Piezoelectric Constant ($d_{14}$)>

Each piezoelectric polymer material of the Examples and the Comparative Example was cut into a size of a length of 1 cm and a width of 3 mm, thereby producing a test piece.

The complex piezoelectric modulus $d_{14}$ of the test piece was measured at a frequency of 10 Hz at room temperature, with "RHEOLO-GRAPH SOLID S-1" manufactured by Toyo Seiki Seisaku-Sho, Ltd. The complex piezoelectric modulus $d_{14}$ was calculated as $d_{14}=d_{14}'-id_{14}''$. The piezoelectric constant measurement was performed five times, and the average value of $d_{14}'$ is shown as the piezoelectric constant in Table 2.

The shearing strain at the time of measuring the piezoelectric constant was 0.05%.

<Evaluation of Melting Point Properties>

Next, each piezoelectric polymer material of the Examples and the Comparative Example was heated from room temperature at a ratio of 10° C. per minute (+10° C./min) to a temperature Tm1+15° C. (hereinafter, referred to as $T_A$). The peak temperature of the melting endothermic curve obtained by a differential scanning calorimeter (DSC-1, manufactured by PerkinElmer, Inc.) was defined as Tm1.

The piezoelectric polymer material was held at $T_A$ for 5 minutes (300 seconds), and subsequently cooled from 200° C. at a ratio of 10° C. per minute (−10° C./min) to 0° C. After the cooling, the piezoelectric polymer material was heated at a ratio of 10° C. per minute (+10° C./min) to $T_A$. The peak temperature of the melting endothermic curve obtained by a differential scanning calorimeter (DSC-1, manufactured by PerkinElmer, Inc.) was defined as Tm2.

The results are shown in Table 2. The numerical values shown in the column "Tm1-Tm2 (° C.)" shown in Table 2 are absolute values.

<Degree of Crystallinity>

Next, the degree of crystallinity [%] of each piezoelectric polymer material was measured by X-ray diffraction. The degree of crystallinity was calculated from an area ratio obtained by performing peak separation of a diffraction profile of the sample into a crystal portion and an amorphous portion, using a measurement apparatus "RINT2500" manufactured by Rigaku Corp. and a degree of crystallinity analysis program manufactured by Rigaku Corp. For the amorphous halo shape, a diffraction profile shape of the sample obtained by rapidly cooling a molten liquid was referred to.

The measurement conditions were as follows:

X ray source: CuKα

Output: 50 kV, 300 mA

Measurement range: 2θ=5 to 35°

Detector: scintillation counter

The results are shown in Table 2.

<Degree of Orientation>

Next, the degree of orientation of each piezoelectric polymer material was measured by X-ray diffraction.

The sample was fixed to a sample holder and the azimuth angle distribution intensity of the peak around 2θ=16° was measured.

RINT2550, manufactured by Rigaku Corp. was used as a device and the measurement conditions were as follows:

X ray source: CuKα

Output: 40 kV, 370 mA

Measurement range: β=−100 to 500°

Detector: scintillation counter

The results are shown in Table 2.

From the measured azimuth angle distribution curve, the degree of axial orientation was calculated by the following equation:

Degree of axial orientation F=(180−α)/180

[In the equation, α represents a half width of the peak derived from the orientation.]

<α Crystal Content>

Next, the crystal content of each piezoelectric polymer material was measured by X-ray diffraction.

The sample was fixed to a sample holder, and the diffraction profile in the meridian direction (MD direction of the sample) was measured by a wide angle X-ray diffraction/reflection method. RINT2550, manufactured by Rigaku Corp. was used as a device and the measurement conditions were as follows:

X ray source: CuKα

Output: 40 kV, 370 mA

Measurement range: 2θ/θ=26 to 36°

Detector: scintillation counter

The α crystal (0010) reflection appears at around a diffraction angle 2θ=32°, and the β crystal (003) reflection appears at around a diffraction angle 2θ=31° and at a diffraction angle lower than the peak derived from the α crystal.

From the peak intensity [I(0010)α] derived from the α crystal and the peak intensity [I(003)β] derived from the β crystal obtained from the X ray diffraction measurement of the piezoelectric polymer material, the α crystal content was defined, and calculated by the following Equation (1).

$$\alpha \text{ crystal content} = I(0010)\alpha / [I(003)\beta + I(0010)\alpha] \quad \text{Equation (1)}$$

The peak intensity was defined as the peak height.
The results are shown in Table 2.

<Longitudinal Elastic Modulus>

The longitudinal elastic modulus [GPa] in the drawing direction of each piezoelectric polymer material was measured by RSA II, manufactured by Rheometric Scientific. The measurement conditions were as follows:

Measuring device: RSA II (manufactured by Rheometric Scientific)
Measurement mode: tension
Sample size: 3.0 mm in width×30 mm in length
Measurement temperature: room temperature (25° C.±5° C.)
Measurement frequency: 10 Hz
Distortion: 0.01%.
The results are shown in Table 2.

<Haze>

The haze value of the piezoelectric polymer materials of Examples 1 to 27 was measured by measuring the light transmittance in a thickness direction, using a device shown below under the following measurement conditions:

Measurement device: HAZE METER TC-H III DPK, manufactured by Tokyo Denshoku CO., LTD.
Sample size: 3 mm in width×30 mm in length, 0.05 mm in thickness
Measurement conditions: with reference to JIS-K7105
Measurement temperature: room temperature (25° C.)
The results are shown in Table 2.

TABLE 1

| | Piezoelectric polymer material | | | | | | |
|---|---|---|---|---|---|---|---|
| | Resin physical properties | | | | Hot pressing | | Preheating |
| | Resin | Chirality | Mw | Mw/Mn | Optical purity | Press temperature (° C.) | Cooling after pressing | before drawing |
| Ex. 1 | PD | D | 600,000 | 1.66 | 99.95 | 230 | Rapid cooling | None |
| Ex. 2 | PD | D | 600,000 | 1.66 | 99.95 | 205 | Slow cooling | None |
| Ex. 3 | PL | L | 650,000 | 1.51 | 99.99 | 205 | Slow cooling | None |
| Ex. 4 | PL | L | 320,000 | 1.60 | 99.99 | 205 | Slow cooling | None |
| Ex. 5 | PL | L | 180,000 | 1.36 | 99.99 | 205 | Slow cooling | None |
| Ex. 6 | LA | L | 150,000 | 1.60 | 98.50 | 205 | Slow cooling | None |
| Ex. 7 | LA | L | 150,000 | 1.70 | 98.50 | 205 | Slow cooling | None |
| Ex. 8 | PD | D | 600,000 | 2.00 | 99.95 | 205 | Slow cooling | None |
| Ex. 9 | PD | D | 600,000 | 2.20 | 99.95 | 205 | Slow cooling | None |
| Ex. 10 | PD | D | 600,000 | 2.00 | 99.95 | 205 | Slow cooling | None |
| Ex. 11 | PD | D | 600,000 | 2.20 | 99.95 | 205 | Slow cooling | None |
| Ex. 12 | PD | D | 600,000 | 1.80 | 99.95 | 205 | Slow cooling | None |
| Ex. 13 | PD | D | 600,000 | 1.80 | 99.95 | 205 | Slow cooling | None |
| Ex. 14 | PD | D | 600,000 | 1.90 | 99.95 | 205 | Slow cooling | None |
| Ex. 15 | PD | D | 600,000 | 1.90 | 99.95 | 205 | Slow cooling | None |
| Ex. 16 | PD | D | 600,000 | 2.20 | 99.95 | 205 | Slow cooling | None |
| Ex. 17 | PD | D | 600,000 | 2.00 | 99.95 | 230 | Rapid cooling | None |
| Comp. Ex. 1 | LA | L | 150,000 | 1.70 | 98.50 | 230 | Rapid cooling | None |

| | Piezoelectric polymer material | | | | | | |
|---|---|---|---|---|---|---|---|
| | Drawing conditions | | | | Annealing conditions | | |
| | Method | Magnification | Temperature (° C.) | Area (mm²) | Temperature (° C.) | Time (second) | Cooling condition |
| Ex. 1 | Uniaxial | 6 | 70 | 7200 | 150 | 15 | Spray |
| Ex. 2 | Solid phase | 6 | 160 | 540 | 150 | 15 | Ice water |
| Ex. 3 | Solid phase | 6 | 160 | 540 | 150 | 15 | Ice water |
| Ex. 4 | Solid phase | 6 | 160 | 540 | 150 | 15 | Ice water |
| Ex. 5 | Solid phase | 6 | 160 | 540 | 150 | 15 | Ice water |
| Ex. 6 | Solid phase | 6 | 145 | 540 | 150 | 15 | Ice water |
| Ex. 7 | Solid phase | 6 | 145 | 630 | 150 | 15 | Ice water |
| Ex. 8 | Solid phase | 6 | 160 | 630 | 150 | 15 | Ice water |
| Ex. 9 | Solid phase | 8 | 160 | 630 | 150 | 15 | Ice water |
| Ex. 10 | Solid phase | 10 | 160 | 630 | 150 | 15 | Ice water |
| Ex. 11 | Solid phase | 12 | 160 | 630 | 150 | 15 | Ice water |
| Ex. 12 | Solid phase | 6 | 150 | 630 | 150 | 15 | Ice water |
| Ex. 13 | Solid phase | 6 | 155 | 630 | 150 | 15 | Ice water |
| Ex. 14 | Solid phase | 6 | 163 | 630 | 150 | 15 | Ice water |
| Ex. 15 | Solid phase | 6 | 165 | 630 | 150 | 15 | Ice water |
| Ex. 16 | Solid phase | 6 | 168 | 630 | 150 | 15 | Ice water |
| Ex. 17 | Uniaxial | 6 | 70 | 7200 | 150 | 15 | Spray |
| Comp. Ex. 1 | Uniaxial | 6 | 70 | 7200 | 150 | 15 | Spray |

In Table 1, in the column "resin", PD represents PURASORB PD, manufactured by PURAC, PL represents PURASORB PL, manufactured by PURAC, and LA represents LACEA (H-100), manufactured by Mitsui Chemicals, Inc. In the Examples and the Comparative Example, resins having the chirality (distinction between D isomer and L isomer), the molecular weight (Mw), and the optical purity shown in Table 1 were used. The unit of the optical purity is [% ee].

The "press temperature" in the column "hot pressing" represents the heating temperature during hot pressing. In the column "cooling after pressing", "rapid cooling" indicates that the temperature was rapidly returned to room temperature with an air cooling fan after hot pressing, and "slow cooling" indicates that the temperature of a hot press machine was set to room temperature of 25° C. and was slowly returned to room temperature while applying pressure to the sheet.

-Uniaxial Drawing-

Next, in order to carry out uniaxial drawing of the film, a rectangular film having a width of 100 mm and a length of 50 mm was cut out from the hot-pressed disk-shaped film. The film was retained for 2 minutes in an oven whose temperature was set at 108° C. and rapidly cooled, thereby obtaining a film before drawing.

The film before drawing was set in a polymer film biaxial drawing device SS-60, manufactured by Shibayama Scientific Co., Ltd., the ends of the film in a 100-mm longitudinal direction were fixed only using uniaxial drawing chucks at a

TABLE 2

| | | | | | | | | Evaluation | | | |
|---|---|---|---|---|---|---|---|---|---|---|---|
| | Tg (° C.) | Tm1 (° C.) | Tm2 (° C.) | Tm1 − Tm2 (° C.) | Tms (° C.) | α crystal content | Degree of crystallinity (%) | Degree of orientation | α crystal content × Degree of crystallinity × Degree of orientation | Longitudinal elastic modulus (GPa) | Piezoelectric constant $d_{14}$ | Haze (%) |
| Ex. 1 | 60.8 | 180.4 | 178.7 | 1.7 | — | 0.12 | 56.0 | 0.980 | 6.6 | 4.27 | 12.0 | 0.935 |
| Ex. 2 | 61.4 | 186.5 | 179.6 | 6.8 | 160.0 | 0.16 | 58.0 | 0.930 | 8.6 | 5.34 | 17.0 | 12.4 |
| Ex. 3 | 60.6 | 188.0 | 182.0 | 6.0 | 160.0 | 0.17 | 58.0 | 0.940 | 9.3 | 4.27 | 17.3 | 12.33 |
| Ex. 4 | 61.8 | 187.0 | 181.5 | 5.5 | 160.0 | 0.17 | 57.0 | 0.940 | 9.1 | 4.89 | 18.0 | 11.75 |
| Ex. 5 | 61.6 | 183.8 | 180.6 | 3.2 | 160.0 | 0.16 | 60.0 | 0.910 | 8.7 | 4.70 | 15.9 | 15.61 |
| Ex. 6 | 60.8 | 169.9 | 167.3 | 2.6 | 155.0 | 0.13 | 56.0 | 0.910 | 6.6 | 3.31 | 11.0 | 12.63 |
| Ex. 7 | 60.8 | 169.9 | 167.3 | 2.6 | 155.0 | 0.13 | 56.0 | 0.910 | 6.6 | 3.31 | 11.0 | 12.04 |
| Ex. 8 | 61.4 | 186.5 | 179.6 | 6.9 | 160.0 | 0.16 | 58.0 | 0.930 | 8.6 | 5.34 | 17.0 | 10.9 |
| Ex. 9 | 62.0 | 185.0 | 178.8 | 6.2 | 160.0 | 0.20 | 55.0 | 0.960 | 10.6 | 5.32 | 18.9 | 10.94 |
| Ex. 10 | 61.0 | 185.6 | 179.3 | 6.3 | 160.0 | 0.15 | 53.5 | 0.965 | 7.7 | 5.16 | 15.5 | 10.49 |
| Ex. 11 | 60.9 | 186.3 | 180.1 | 6.2 | 160.0 | 0.10 | 52.0 | 0.970 | 5.0 | 2.89 | 11.0 | 8.805 |
| Ex. 12 | 60.2 | 184.6 | 179.6 | 5.0 | 160.0 | 0.17 | 54.0 | 0.940 | 8.6 | 4.33 | 14.3 | 11.35 |
| Ex. 13 | 61.2 | 186.3 | 178.8 | 6.5 | 160.0 | 0.17 | 55.0 | 0.940 | 8.8 | 5.02 | 16.8 | 11.82 |
| Ex. 14 | 60.8 | 184.3 | 179.6 | 4.7 | 160.0 | 0.16 | 56.0 | 0.940 | 8.4 | 4.71 | 17.0 | 10.76 |
| Ex. 15 | 60.8 | 185.3 | 179.8 | 5.5 | 160.0 | 0.16 | 55.0 | 0.940 | 8.3 | 4.40 | 16.0 | 11.29 |
| Ex. 16 | 60.8 | 184.5 | 178.8 | 5.7 | 160.0 | 0.19 | 58.0 | 0.940 | 10.4 | 4.14 | 16.0 | 11.19 |
| Ex. 17 | 58.0 | 174.7 | 176.7 | 2.0 | — | 0.12 | 56.0 | 0.980 | 6.8 | 4.27 | 12.0 | 0.935 |
| Comp. Ex. 1 | 60.0 | 166.1 | 166.0 | 0.1 | — | 0.08 | 64.0 | 0.980 | 5.0 | 3.64 | 9.0 | 3.193 |

Comparative Examples 2 to 4

Piezoelectric polymer materials 102 to 104 of Comparative Examples 2 to 4 were produced by the following process. The piezoelectric constant and the haze of the obtained piezoelectric polymer materials 102 to 104 were measured in the same manner as in the piezoelectric polymer material 1 of Example 1.

Comparative Example 2

About 4 g of pellets of a helical chiral polymer (polylactic acid H-100, manufactured by Mitsui Chemicals Inc., registered trademark: LACEA, weight average molecular weight Mw: 150,000) was weighed, and sandwiched between two 250 mm-square SUS plates having a thickness of 5 mm via a 250 mm-square aluminum plate spacer having a thickness of 0.15 mm and having a disk-shaped hole with a diameter of 150 mm. This was retained at 5 MPa for 3 minutes with a hot plate whose temperature was set at 205° C. with a hot press machine manufactured by Toyo Seiki Seisaku-Sho, Ltd. (trademark: MINI TEST PRESS). After the hot pressing, the temperature was rapidly returned to room temperature with an air cooling fan while applying pressure, thereby obtaining a disk-shaped film having a diameter of 150 mm and a thickness of 150 μm.

portion 1 cm from the ends, such that the shape of the film before drawing was substantially 100 mm in width and 30 mm in length.

The temperature in a drawing device was set at 80° C., and the drawing operation was initiated immediately after the temperature in the drawing device and the film surface temperature reached 80° C. Regarding the conditions for drawing, the setting temperature in the drawing device was 80° C., the draw ratio was 4 times, and the drawing rate was 30 mm/min.

After drawing the film, the setting temperature in the device was set at 108° C. After the temperature in the device and the film surface temperature reached 108° C., the temperature was maintained for 2 minutes. Then, the film was sprayed with 134aQREI spray (cooling spray), manufactured by Sunhayato Corp., and the temperature was cooled to a temperature equal to or lower than the glass transition point of the film.

The piezoelectricity (piezoelectric constant) of the piezoelectric polymer material 102 of Comparative Example 2 was evaluated. As a result, the piezoelectric constant was 10 pC/N. The haze was evaluated in a similar manner. As a result, the haze value of the piezoelectric polymer material 102 was 74.1.

Comparative Example 3

The piezoelectric polymer material 103 of Comparative Example 3 was produced in the same manner as in Comparative Example 2, except that pellets of polylactic acid H-400, manufactured by Mitsui Chemicals, Inc. (registered. trademark: LACEA, weight average molecular weight Mw: 200,000) were used as the helical chiral polymer.

The piezoelectricity (piezoelectric constant) of the piezoelectric polymer material 103 was evaluated in the same manner as in the evaluation of piezoelectric polymer material 1 of Example 1. As a result, the piezoelectric constant was 10 pC/N. The haze was evaluated in a similar manner. As a result, the haze value of the piezoelectric polymer material 103 was 50.7.

Comparative Example 4

The piezoelectric polymer material 104 of Comparative Example 4 was produced in the same manner as in Comparative Example 2, except that pellets of PURASORB PD (registered trademark) (weight average molecular weight Mw: 600,000) manufactured by PURAC were used as the helical chiral polymer.

The piezoelectricity (piezoelectric constant) of the obtained piezoelectric polymer material 104 was evaluated in the same manner as in the piezoelectric polymer material 1 of Example 1. As a result, the piezoelectric constant was 12 pC/N. The haze was evaluated in a similar manner. As a result, the haze value of the piezoelectric polymer material 104 was 70.8.

Examples 18 to 22 and Examples 24 to 26

Piezoelectric polymer materials 18 to 22 of Examples 18 to 22 and piezoelectric polymer materials 24 to 26 of Examples 24 to 26 were produced in the same manner as in the preparation of the sheet before drawing A21 in Example 2, except that a sheet before drawing was produced by using pellets of polylactic acid shown in Table 3 at a temperature for hot pressing shown in Table 3, and that the obtained sheet was subjected to the following preheating treatment before drawing.

-Preheating Process Before Drawing-

The preheating process before drawing was performed as follows.

A sheet before drawing of Examples 18 to 22 and Examples 24 to 26 were produced in the same manner as in Example 2, except that pellets of polylactic acid shown in Table 3 were used in place of the resin (PD) used in Example 2, and the temperature for hot pressing was set to a temperature shown in Table 3. The sheet before drawing, while being sandwiched by the burets, was heated at 130° C. to 160° C. for 15 minutes (preheating process before drawing).

-Solid Phase Drawing-

The sheets before drawing, after being subjected to the preheating process, was subjected to solid phase drawing in the same manner as in the preheating process before drawing A21 of Example 2.

Example 23 and Example 27

A piezoelectric polymer material 23 of Example 23 and a piezoelectric polymer material 27 of Example 27 were produced in the same manner as in Example 1, except that pellets of polylactic acid shown in Table 3 were used in place of the resin used in Example 1, the temperature for hot pressing was set to a temperature shown in Table 3, and the temperature for the hot press machine was slowly returned to room temperature of 25° C. after the hot pressing while applying pressure.

In Table 3, the following material was used for the resin (polylactic acid) indicated as PD.

Product name: PURASORB PD, manufactured by PURAC, molecular weight Mw: 600,000, Tm1: 191° C., Tg: 60° C., Tms: 164° C.

In Table 3, the following substance was used for the resin (polylactic acid) indicated as LA.

Product name: LACEA (H-100), manufactured by Mitsui Chemicals, Inc., molecular weight Mw: 150,000, Tm1: 176° C., Tg: 59° C., Tms: 160° C.

<Evaluations>

The optical purity and the molecular weight distribution (Mw/Mn) of the resin (optically active polymer) contained in the piezoelectric polymer material, and the glass transition temperature Tg, the temperature Tms at a point of inflection, the melting points Tm1 and Tm2, the piezoelectric constant, the degree of crystallinity, the degree of orientation, the longitudinal elastic modulus, and the haze of the piezoelectric polymer materials 18 to 27 of Examples 18 to 27 were measured. The results are shown in Tables 3 and 4.

The measurement of the optical purity and the molecular weight distribution (Mw/Mn) of the resin (optically active polymer) contained in the piezoelectric polymer material, the glass transition temperature Tg, the temperature Tms at a point of inflection, the melting points Tm1 and Tm2, the piezoelectric constant, the degree of crystallinity, the degree of orientation, the longitudinal elastic modulus, and the haze of the piezoelectric polymer material were measured in the same manner as the measurement of the piezoelectric polymer materials 1 to 17 described above. The values shown in the column "Tm1-Tm2 (° C.)" in Table 4 are absolute values.

With respect to the piezoelectric polymer materials 18 to 27, when the melting endothermic curve obtained by a differential scanning calorimeter in the measurement for Tm1 shows two or more endothermic peaks, the melting point Tm3, which is the temperature of the peak located at the lowest temperature, was measured and shown in Table 4, in addition to the melting point Tm1, which is the temperature of the peak located at the highest temperature. Table 4 also shows a difference between Tm1 and Tm3 (Tm1-Tm3) obtained by the evaluation of melting point properties. The values shown in the column "Tm1-Tm3 (° C.)" in Table 3 are absolute values.

TABLE 3

| | Piezoelectric polymer material | | | | | | |
|---|---|---|---|---|---|---|---|
| | Resin physical properties | | | | Hot press | | Preheating |
| | Resin | Chirality | Mw | Mw/Mn | Optical purity | Press temperature (° C.) | Cooling after pressing | before drawing |
| Ex. 18 | PD | D | 600,000 | 1.66 | 99.95 | 250 | Slow cooling | 15 min |
| Ex. 19 | PD | D | 600,000 | 1.66 | 99.95 | 250 | Slow cooling | 15 min |
| Ex. 20 | PD | D | 600,000 | 1.66 | 99.95 | 250 | Slow cooling | 15 min |
| Ex. 21 | PD | D | 600,000 | 1.66 | 99.95 | 250 | Slow cooling | 15 min |
| Ex. 22 | PD | D | 600,000 | 1.66 | 99.95 | 250 | Slow cooling | 15 min |
| Ex. 23 | PD | D | 600,000 | 1.66 | 99.95 | 250 | Slow cooling | None |
| Ex. 24 | LA | L | 150,000 | 1.70 | 98.50 | 205 | Slow cooling | 15 min |
| Ex. 25 | LA | L | 150,000 | 1.70 | 98.50 | 205 | Slow cooling | 15 min |
| Ex. 26 | LA | L | 150,000 | 1.70 | 98.50 | 205 | Slow cooling | 15 min |
| Ex. 27 | LA | L | 150,000 | 1.70 | 98.50 | 205 | Slow cooling | None |

| | Piezoelectric polymer material | | | | | | |
|---|---|---|---|---|---|---|---|
| | Drawing conditions | | | | Annealing conditions | | |
| | Method | Magnification | Temperature (° C.) | Area (mm$^2$) | Temperature (° C.) | Time (second) | Cooling condition |
| Ex. 18 | Solid phase | 4 | 160 | 540 | 150 | 15 | Ice water |
| Ex. 19 | Solid phase | 6 | 160 | 630 | 150 | 15 | Ice water |
| Ex. 20 | Solid phase | 8 | 160 | 630 | 150 | 15 | Ice water |
| Ex. 21 | Solid phase | 10 | 160 | 630 | 150 | 15 | Ice water |
| Ex. 22 | Solid phase | 12 | 160 | 630 | 150 | 15 | Ice water |
| Ex. 23 | Uniaxial | 6 | 70 | 7200 | 110 | 15 | Ice water |
| Ex. 24 | Solid phase | 4 | 130 | 540 | 110 | 15 | Ice water |
| Ex. 25 | Solid phase | 6 | 130 | 630 | 110 | 15 | Ice water |
| Ex. 26 | Solid phase | 8 | 130 | 630 | 110 | 15 | Ice water |
| Ex. 27 | Uniaxial | 6 | 70 | 7200 | 110 | 15 | Ice water |

In Table 3, in the column "resin", PD represents PURASORB PD, manufactured by PURAC, and LA represents LACEA (H-100), manufactured by Mitsui Chemical Co., Ltd. In the Examples and the Comparative Examples, resins having the chirality (distinction between D isomer and L isomer), the molecular weight (Mw) and the optical purity shown in Table 3 were used. The unit of the optical purity is [% ee].

The "press temperature" in the column "hot pressing" represents the heating temperature during hot pressing. In the column "cooling after pressing", "slow cooling" indicates that the temperature of a hot press machine after the hot pressing was set to room temperature of 25° C. and was slowly returned to room temperature while applying pressure to the sheet.

TABLE 4

| | Evaluation | | | | | | | | | | | | |
|---|---|---|---|---|---|---|---|---|---|---|---|---|---|
| | Tg (° C.) | Tm1 (° C.) | Tm2 (° C.) | Tm1 − Tm2 (° C.) | Tm3 (° C.) | Tm1 − Tm3 (° C.) | Tms (° C.) | α crystal content | Degree of crystallinity (%) | Degree of orientation | α crystal content × Degree of crystallinity × Degree of orientation | Longitudinal elastic modulus (GPa) | Piezoelectric constant $d_{14}$ | Haze (%) |
| Ex. 18 | 61.1 | 185.9 | 181.3 | 4.6 | | | 160.0 | 0.20 | 64.6 | 0.920 | 11.9 | 2.90 | 13.0 | 8.5 |
| Ex. 19 | 61.5 | 186.8 | 180.3 | 6.5 | | | 160.0 | 0.16 | 54.6 | 0.930 | 8.1 | 3.73 | 18.0 | 9.8 |
| Ex. 20 | 62.0 | 186.3 | 181.1 | 5.2 | 170.6 | 15.7 | 160.0 | 0.20 | 59.8 | 0.950 | 11.4 | 4.06 | 19.8 | 10.8 |
| Ex. 21 | 59.7 | 183.7 | 180.0 | 3.7 | 177.7 | 6.0 | 160.0 | 0.15 | 63.4 | 0.960 | 9.1 | 4.72 | 27.0 | 9.2 |
| Ex. 22 | 63.0 | 185.6 | 180.5 | 5.1 | 168.9 | 16.7 | 160.0 | 0.12 | 54.5 | 0.970 | 6.3 | 1.98 | 20.0 | 9.3 |
| Ex. 23 | 63.0 | 177.7 | 177.2 | 0.5 | | | — | 0.20 | 57.3 | 0.930 | 10.7 | 4.26 | 12.0 | 12.7 |
| Ex. 24 | 61.3 | 168.1 | 166.9 | 1.2 | | | 155.0 | 0.16 | 44.4 | 0.920 | 6.5 | 2.80 | 10.0 | 6.8 |
| Ex. 25 | 61.2 | 169.6 | 167.1 | 2.5 | 150.3 | 19.3 | 155.0 | 0.18 | 45.3 | 0.930 | 7.6 | 3.29 | 18.0 | 11.7 |
| Ex. 26 | 63.8 | 170.0 | 167.1 | 2.9 | 153.3 | 16.7 | 155.0 | 0.20 | 47.6 | 0.940 | 8.9 | 2.06 | 24.0 | 6.9 |
| Ex. 27 | 61.1 | 167.5 | 166.6 | 0.9 | | | — | 0.08 | 43.1 | 0.910 | 3.1 | 4.09 | 10.0 | 3.2 |

Furthermore, the SAXS (Small Angle X-ray Scattering) measurement was carried out with the piezoelectric polymer materials 18 to 26; the temperature dependency of the elastic modulus was evaluated with the piezoelectric polymer materials 21 and 23; and the temperature dependency of the piezoelectric constant was evaluated with the piezoelectric polymer materials 20, 25 and 27 of Examples 20, 25 and 27. The details are shown below.

-SAXS Measurement-

The SAXS measurement was carried out with the piezoelectric polymer materials 18 to 26 under the following measurement conditions using a device shown below. The SAXS measurement was performed in the MD direction, which is a drawing direction of the piezoelectric polymer materials 18 to 26, and the TD direction, which is a direction orthogonal to the MD direction, respectively. The results are shown in FIGS. 9 to 12. The SAXS measurement in the TD direction was not carried out with the piezoelectric polymer material 21.

(Measurement Device)

The SAXS measurement was carried out by small angle/wide angle scattering experiment beamline BL40B2, installed in a large-scale synchrotron radiation facility SPring-8 (Hyogo prefecture).

(Measurement Conditions)

X rays: X rays having a wavelength of 1 Å (0.1 nm)

Detector: CCD

Measurement temperature: room temperature (25° C.)

Sample size: 3 mm×30 mm

Figure 9:
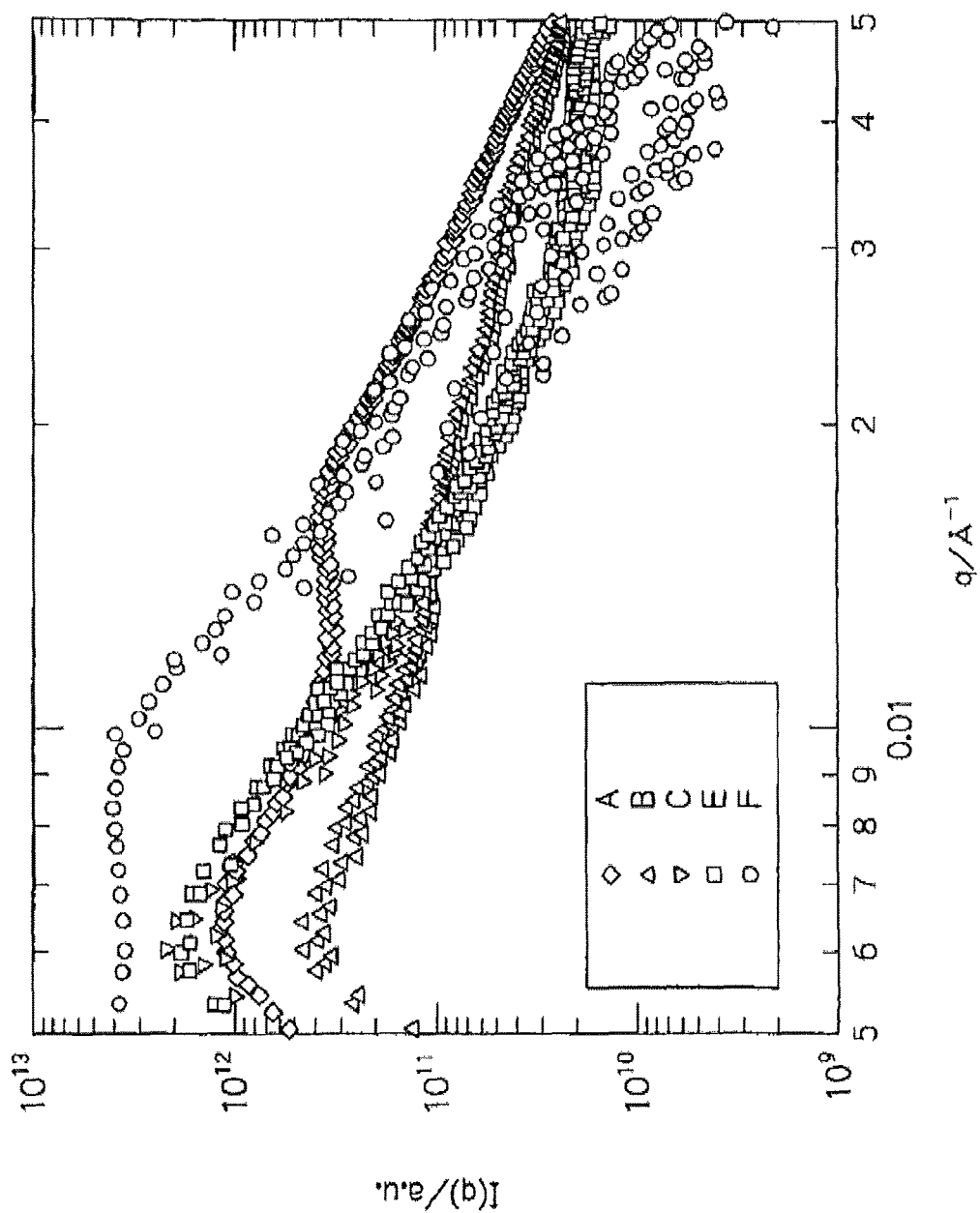
FIG. 9 shows SAXS curves (TD direction) for piezoelectric polymer materials obtained in Examples 18 to 20, 22, and 23.
Figure 10:
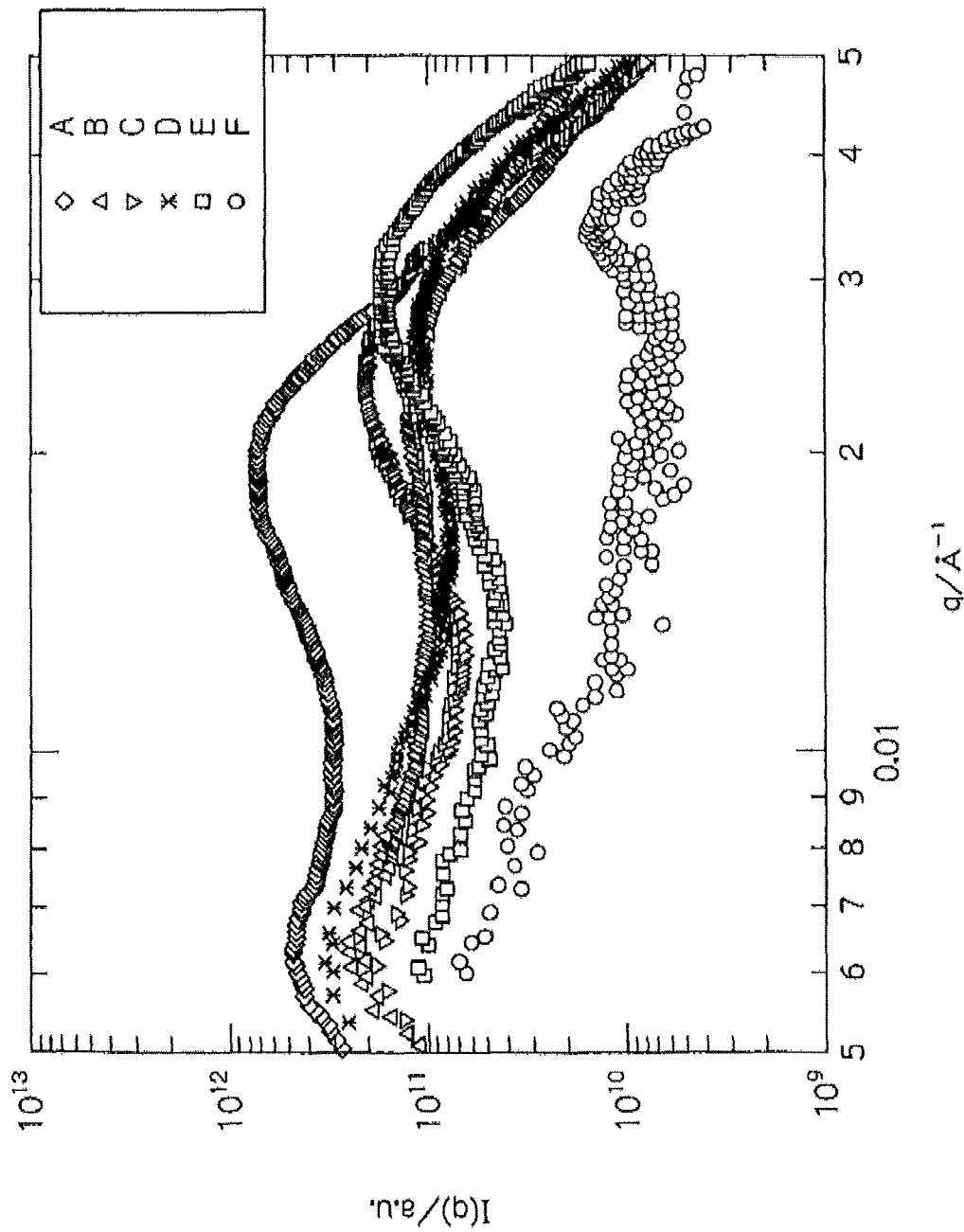
FIG. 10 shows SAXS curves (MD direction) for piezoelectric polymer materials obtained in Examples 18 to 22.
Figure 11:
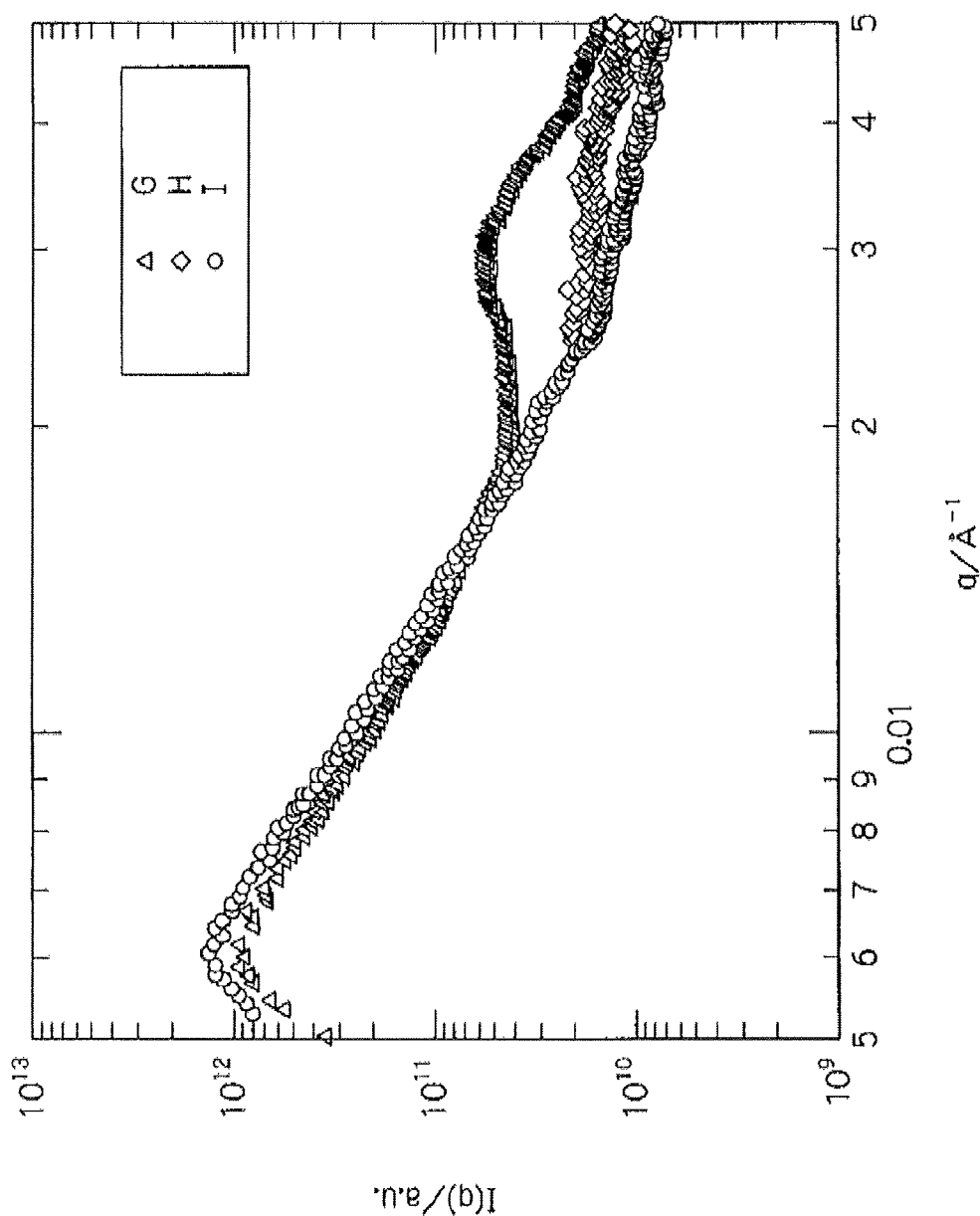
FIG. 11 shows SAXS curves (TD direction) for piezoelectric polymer materials obtained in Examples 24 to 26.
Figure 12:
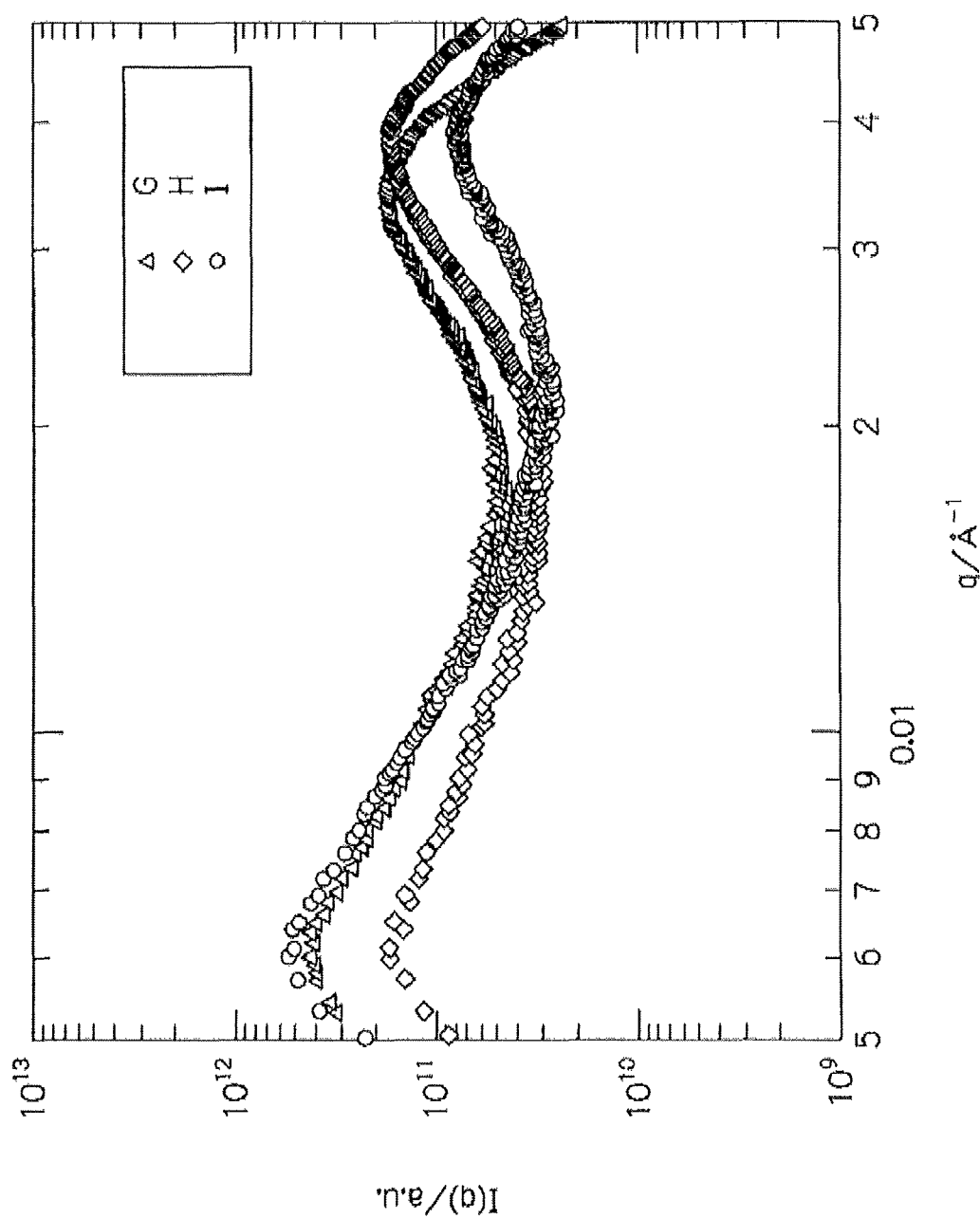
FIG. 12 shows SAXS curves (MD direction) for piezoelectric polymer materials obtained in Examples 24 to 26.

FIG. 9 shows the SAXS curves (TD direction) obtained with the piezoelectric polymer materials 18 to 20, 22 and 23 of Examples 18 to 20, 22, and 23. FIG. 10 shows the SAXS curves (MD direction) obtained with the piezoelectric polymer materials 18 to 22 of Examples 18 to 22. FIG. 11 shows the SAXS curves (TD direction) obtained with the piezoelectric polymer materials 24 to 26 of Examples 24 to 26. FIG. 12 shows the SAXS curves (MD direction) obtained with the piezoelectric polymer materials 24 to 26 of Examples 24 to 26.

In FIGS. 9 and 10, the curves represented by the plots A to F each represent the curves obtained with the piezoelectric polymer materials 18 to 23, respectively. In FIGS. 11 and 12, the curves represented by the plots G to I each represent the curves obtained with the piezoelectric polymer materials 24 to 26.

From the region in which q is larger than 0.01 [Å$^{-1}$] of the SAXS curves, the crystal structure of the piezoelectric polymer materials is figured out.

In FIGS. 9 and 10, the plots A, B, C, D and E each represent the SAXS curves obtained with the piezoelectric polymer materials 18 to 22, which were subjected to drawing process at 150° C. by solid phase drawing at draw ratios of 4, 6, 8, 10 and 12, respectively. The plot F represents the SAXS curve obtained with the piezoelectric polymer material 23 which was subjected to a different drawing process, i.e., the drawing was performed at 70° C. by uniaxial drawing at a draw ratio of 6.

From FIG. 9, the crystal structure in a direction orthogonal to the drawing direction of the piezoelectric polymer materials, i.e., TD direction, is figured out.

In FIG. 9, when the plot A of the piezoelectric polymer material 18, with a low draw ratio (4 times), is compared with the plot E of the piezoelectric polymer material 22, with a high draw ratio (12 times), it is found that the plot A has a broad peak, whereas the plot E does not have such a peak and the intensity I(q) is low, at around a scattering vector q of 0.02 [Å$^{-1}$]. The reason for this is considered to be that a low crystal phase is squashed to be small as a result of drawing the piezoelectric polymer material at a high draw ratio.

The changes in the broad peak in a region at which the scattering vector q is larger than 0.01 [Å$^{-1}$] are also seen from the SAXS curves represented by the plots G, H, and I of FIG. 11. The plots G, H and I each represent the SAXS curves for the piezoelectric polymer materials 24 to 26, which were subjected to a drawing process at 130° C. by solid phase drawing at draw ratios of 4, 6, and 8, respectively.

In FIG. 11, when the plot G of the piezoelectric polymer material 24 with a low draw ratio (4 times) is compared with the plot I of the piezoelectric polymer material 26 with a high draw ratio (8 times), the plot A has a broad peak but the plot E does not have such a peak and the intensity I(q) is low at around a scattering vector q of 0.03 [Å$^{-1}$].

The reason for this is considered to be that a low crystal phase is squashed to be small, also in the piezoelectric polymer material 26.

The crystal structure of the piezoelectric polymer materials in the drawing direction, i.e., MD direction, can be figured out from FIGS. 10 and 12. Both in FIGS. 10 and 12, a broad peak appears in a region in which the scattering vector q is larger than 0.01 [Å$^{-1}$]. Therefore, it is considered that a crystal structure having a continuous structure, in which low crystal phases and high crystal phases are arranged in line and the region of low crystal phases are not squashed, is formed in the MD direction irrespective of whether the piezoelectric polymer materials is drawn at a low draw ratio or at a high draw ratio.

The curve of the plot A in FIG. 9 shows that the piezoelectric polymer material 18 with a low draw ratio (4 times) has a continuous structure of low crystal phases and high crystal phases with a structure cycle of 50 nm in the TD direction. The curve of the plot A in FIG. 10 shows that the piezoelectric polymer material 18 has a continuous structure of low crystal phases and high crystal phases with a structure cycle of 40 nm in the MD direction.

In contrast, the curve of the plot E in FIG. 9 shows that, in the piezoelectric polymer material 22 with a high draw ratio (12 times), no structure cycle is observed in a range of 12.5 to 80.0 nm in the TD direction, and a periodic continuous structure of low crystal phases and high crystal phases is not formed. The curve of the plot E in FIG. 10 shows that the piezoelectric polymer material 22 has a continuous structure of low crystal phases and high crystal phases with a structure cycle of 30 nm in the MD direction.

In view of the above, it is proved that the continuous structure of low crystal phases and high crystal phases is formed in the piezoelectric polymer material 18 with a low draw ratio (4 times). On the other hand, it is proved that the piezoelectric polymer material 22 with a high draw ratio (12 times) shows a continuous structure of low crystal phases and high crystal phases in the MD direction, but does not substantially show a continuous structure of low crystal phases and high crystal phases in the TD direction.

-Evaluation of Temperature Dependency of Elastic Modulus-

The temperature dependency of the elastic modulus of the piezoelectric polymer materials was evaluated with the piezoelectric polymer material 21 of Example 21 and the piezoelectric polymer material 23 of Example 23, using the following measuring device under the following measurement conditions.

Measuring device: RSA II (manufactured by Rheometric Scientific)

Measurement mode: tension mode

Measurement temperature: room temperature (25° C.±5° C.)

Measurement frequency: 10 Hz

Distortion: 0.01%

Sample size. 3.0 mm in width×30 mm in length

Figure 13:
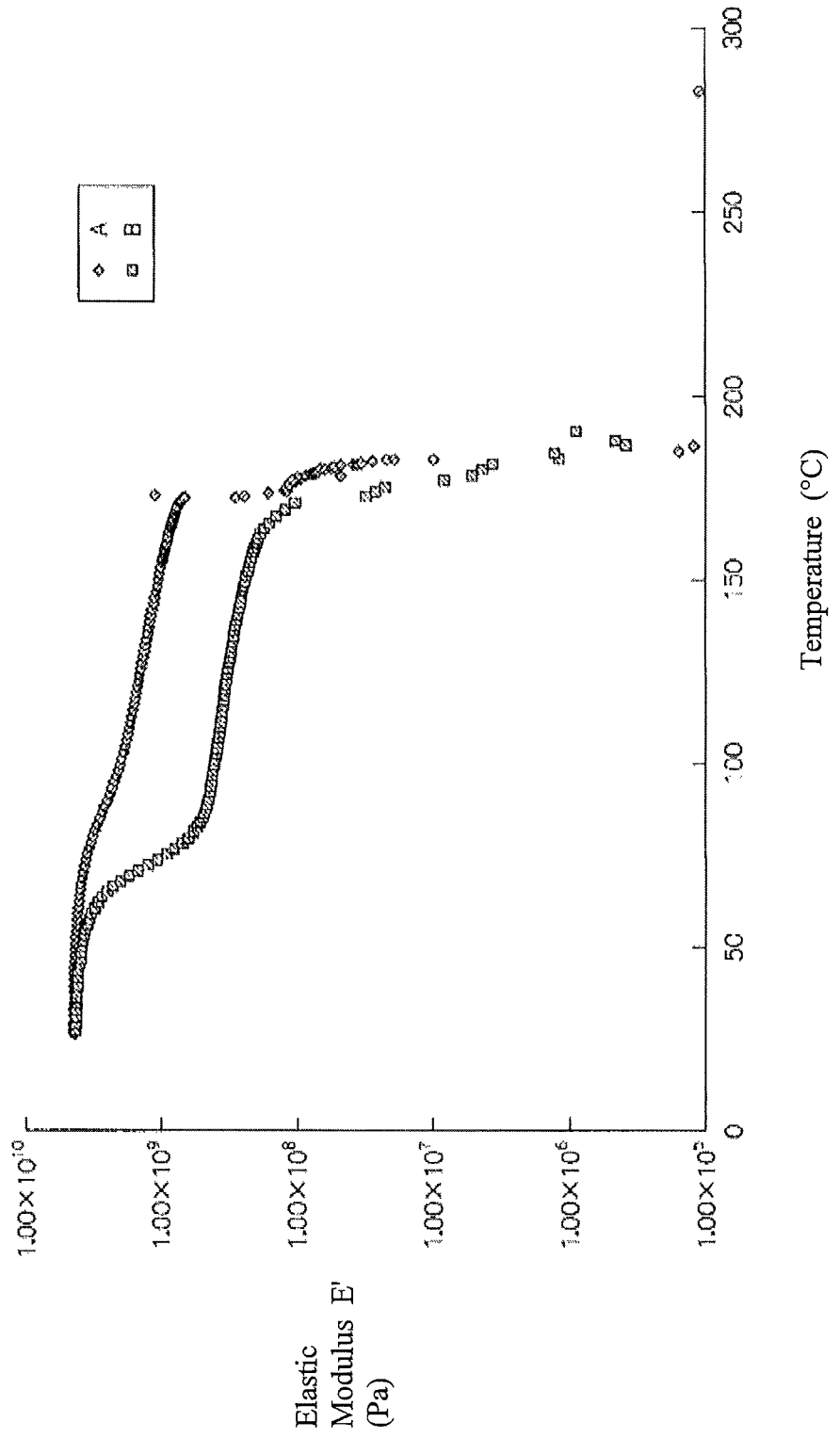
FIG. 13 shows elastic modulus E'-temperature curves of piezoelectric polymer materials obtained in Examples 21 and 23.

The results are shown in FIG. 13.

FIG. 13 shows elastic modulus E'-temperature curves obtained from the piezoelectric polymer material 21 and the piezoelectric polymer material 23. In FIG. 13, the curve represented by the plot A represents the changes in the elastic modulus of the piezoelectric polymer material 21 which has been subjected to drawing at a draw ratio of 10 times at 160° C. by solid phase drawing. The curve represented by the plot B represents the changes in the elastic modulus of the piezoelectric polymer material 23 which has been subjected to drawing at a draw ratio of 6 times at 70° C. by uniaxial drawing.

It is proved that the elastic modulus E' of the piezoelectric polymer material 23, which has been uniaxially drawn, sharply decreases in a range from 60° C. to 90° C. In contrast, the elastic modulus E' of the piezoelectric polymer material 21, which has been subjected to solid phase drawing, changes from about 70° C. but the amount or the width of the change is small, which shows that the elastic modulus E' is hardly dependent on temperatures.

The piezoelectric constant of all of the piezoelectric polymer materials of the Examples was 10.0 pC/N or more, and a poling process is not necessary in all of the piezoelectric polymer materials. It is also proved that the piezoelectric polymer materials of the Examples exhibit excellent transparency and elasticity.

In particular, since the piezoelectric polymer materials that have been subjected to solid phase drawing exhibit elasticity that is hardly dependent on temperatures, it is considered that the effects of using a piezoelectric polymer material are hardly impaired even when the piezoelectric polymer materials of the Examples are used as a raw material for manufacturing electronic devices that tend to heat.

-Evaluation of Temperature Dependency of Piezoelectric Constant-

In the measurement of the piezoelectric constant shown in Table 4, the temperature dependency of the piezoelectric constant of the piezoelectric polymer materials 20, 25 and 27 of Examples 20, 25 and 27 were further evaluated. The evaluation results are shown in FIG. 14.

Figure 14:
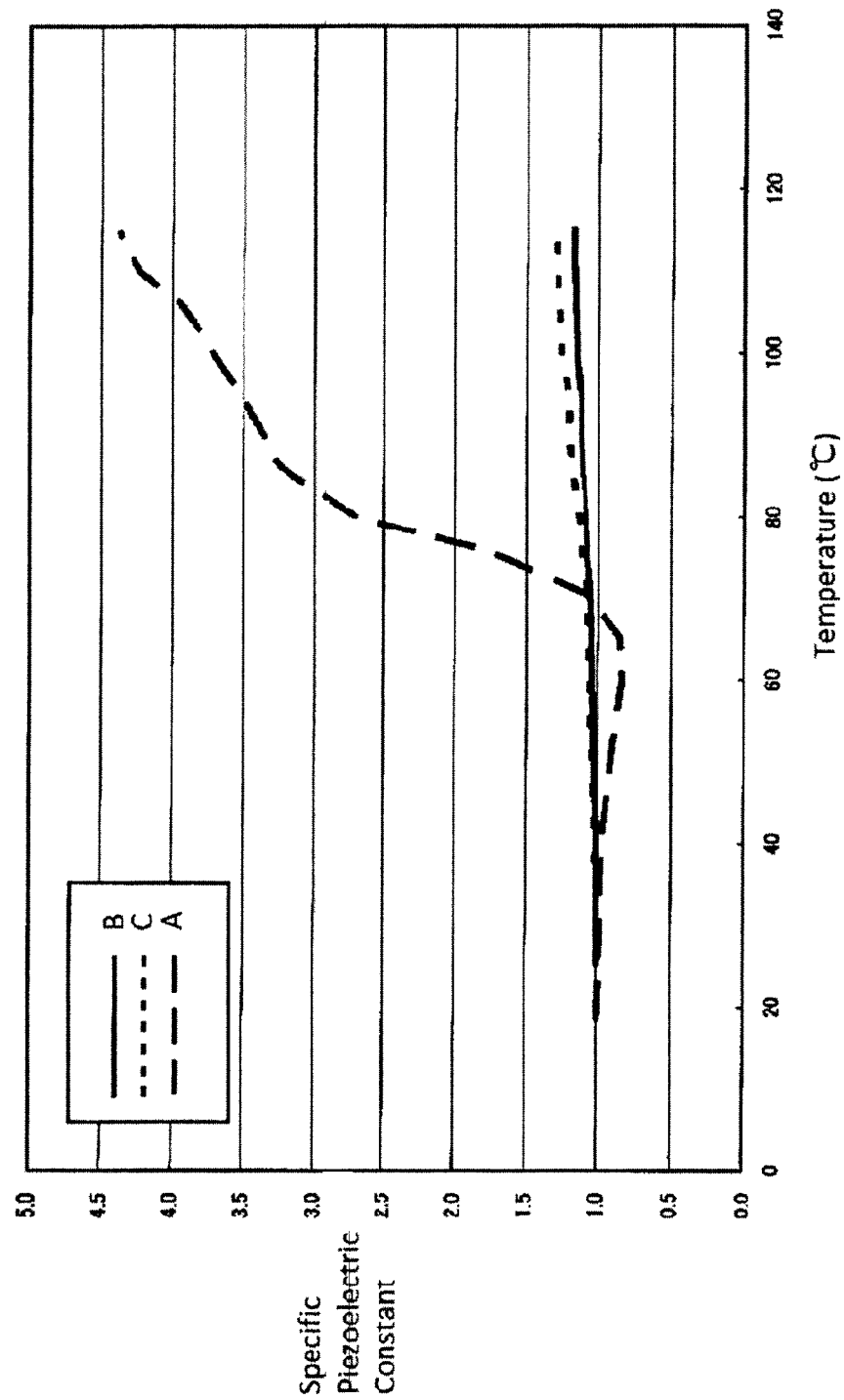
FIG. 14 shows piezoelectric constant-temperature curves of piezoelectric polymer materials obtained in Examples 20, 25 and 27.

FIG. 14 shows the specific piezoelectric constant-temperature curve for the piezoelectric polymer materials 20, 25 and 27 of Examples 20, 25 and 27. Here, the term "specific piezoelectric constant" represents the ratio of the piezoelectric constant at each temperature to the piezoelectric constant at 25° C. of the piezoelectric polymer materials 20, 25, and 27. More specifically, when the piezoelectric constant at 25° C. is defined as $D_{25}$ and the piezoelectric constant at a temperature T° C. is defined as $D_T$, the specific piezoelectric constant is represented by $D_T/D_{25}$.

In FIG. 14, the curve A represents a specific piezoelectric constant-temperature curve for the piezoelectric polymer material 27 of Example 27 that has been subjected to uniaxial drawing at a draw ratio of 6 times. The curve B represents a specific piezoelectric constant-temperature curve for the piezoelectric polymer material 25 of Example 25 that has been subjected to solid phase drawing at a draw ratio of 6 times. The curve C represents a specific piezoelectric constant-temperature curve for the piezoelectric polymer material 20 of Example 20 that has been subjected to solid phase drawing at a draw ratio of 8 times.

As is seen from the comparison of the curve A, the curve B and the curve C, it is proved that by subjecting the piezoelectric polymer material to solid phase drawing, the piezoelectric constant maintains a stable value that is hardly dependent on temperatures. Based on the results, it is presumed that by using a piezoelectric polymer material that has been subjected to solid phase drawing as a raw material for piezoelectric elements or piezoelectric devices, piezoelectric elements or piezoelectric devices having a piezoelectricity that is hard to change due to temperature changes and being stable in function can be produced.

Example 28

A piezoelectric element 1 was manufactured using the piezoelectric polymer material 21 of Example 21, and a piezoelectric device using the piezoelectric element 1 was manufactured as follows.

-Production of Piezoelectric Element 1-

The piezoelectric polymer material 21 was melt at 230° C. by a melt extruder, and brought into contact with a cast roll of 20° C., thereby obtaining a rapid-cooled film having a width of 200 mm and a thickness of 300 μm. The film was annealed at 100° C. for 3 hours in order to form spherulites in the film to increase the degree of crystallinity. The film was preheated to 160° C., and further rolled with a roll whose temperature was set to 160° C. to squash the spherulites. Then, the film was drawn at a draw ratio of 5 times and oriented in a film flow direction, thereby obtaining a 60 μm-thick film. Both surfaces of the film were annealed by bringing into contact with a roll whose temperature was set to 150° C., while applying tension so as not to loosen the film. Thereafter, both surfaces of the film were rapidly cooled by bringing into contact with a roll whose temperature was set to 20° C., thereby obtaining a piezoelectric polymer film having a width of 200 mm. The film was cut into a rectangular shape having a width of 130 mm and a longitudinal length of 160 mm, thereby preparing a piezoelectric element 1.

-Production of Piezoelectric Device 1-

The edges of one surface of the piezoelectric element 1 having a size of 130 mm×160 mm were masked with a 3 mm-wide metal ribbon, and a 50 nm-thick ITO transparent conductive film was formed using a sputtering device. Similarly, a mask was formed on the opposite surface of the piezoelectric element 1 and an ITO transparent conductive film was formed, thereby preparing a piezoelectric device 1 [transparent piezoelectric speaker].

The obtained piezoelectric element 1 had a piezoelectric constant of 18 pC/N and a haze value of 10. When the piezoelectric device 1, which was produced by using the piezoelectric element 1, was set in a frame that was bent in a longitudinal direction with a radius of curvature of (30) cm, and a sine wave of 200 Vpp and 1 kHz was applied thereto. The sound pressure at a position 10 cm apart from the speaker, as measured by RION PRECISON SOUND LEVEL METER NA-40, was 80 dB. In view of the above, it is considered that the piezoelectric element and the piezoelectric device according to the present embodiment are excellent in transparency and sound pressure, and are suitably applied to various fields relevant to piezoelectric speakers.

Description Of Reference Numerals

| | |
|---|---|
| 2 | SUS plate |
| 4 | Spacer |
| 10 | Heat and pressure application device (hot press machine) |
| 12 | Buret |
| 16 | Film (film before drawing) |
| 18 | Heater block |
| 20 | Cylinder |
| 22 | Die |
| 24 | Die setscrew |
| 30 | Heat and pressure application device (solid phase drawing device) |
| 52 | Piezoelectric polymer material film |
| 54 | Hot roll pair |
| 56 | Preheating portion |
| 62 | Unwinding portion |
| 64 | Winding portion |
| 68 | Cooling roll |
| 72 | Preheating portion |
| 74 | Preheating portion |
| 76 | Annealing heat portion |
| 82 | Hot roll pair |
| 84 | Hot roll pair |
| 102 | High crystal phase |
| 104 | Low crystal phase |
| 106 | High crystal phase |
| 108 | Low crystal phase |

The entire disclosure of Japanese Patent Application No. 2009-061401 and Japanese Patent Application No. 2009-061402 is incorporated by reference in this specification.

All contents of the documents, patent applications, and technical standards described in this specification are incorporated herein by reference to the same extent as that when it is specifically and individually described that the respective documents, patent applications, and the technical standards are incorporated herein by reference.

The invention claimed is:

1. A piezoelectric polymer material comprising a helical chiral polymer having a weight average molecular weight of from 50,000 to 1,000,000 and having optical activity, the piezoelectric polymer material having a piezoelectric constant $d_{14}$ at 25° C. of 10 pC/N or more, a degree of crystallinity obtained by X-ray diffraction of from 40% to 80%, and a haze of from 0.5 to 30.

2. The piezoelectric polymer material according to claim 1, wherein the helical chiral polymer comprises a repeating unit represented by the following Formula (1) as a main chain:

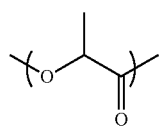

(1)

3. The piezoelectric polymer material according to claim 1, wherein the piezoelectric polymer material is a piezoelectric polymer material P1, the piezoelectric polymer material P1 having a continuous structure of a low crystal phase and a high crystal phase with a structure cycle of 12.5 nm to 80.0 nm in a direction substantially parallel with a screw axis of a spiral structure of the helical chiral polymer, and substantially not having the continuous structure in a direction substantially parallel with one direction orthogonal to the screw axis, and wherein the piezoelectric polymer material has a difference between Tm1 and Tm2 of from 2° C. to 10° C., Tm1 being the highest melting point derived from the helical chiral polymer among melting points of the piezoelectric polymer material P1 obtained by differential scanning calorimetry, and Tm2 being a melting point derived from the helical chiral polymer of a piezoelectric polymer material P2 obtained by differential scanning calorimetry, the piezoelectric polymer material P2 being obtained by heating the piezoelectric polymer material P1 to Tm1+15° C., melting for 5 minutes, and then cooling to 0° C. at −10° C./min.

4. The piezoelectric polymer material according to claim 3, wherein when the piezoelectric polymer material has two or more melting points derived from the helical chiral polymer obtained by differential scanning calorimetry, the difference between the lowest melting point Tm3 among the melting points and the melting point Tm1 is within 30° C.

5. The piezoelectric polymer material according to claim 3, wherein the melting point Tm1 is 160° C. or more and lower than 250° C.

6. The piezoelectric polymer material according to claim 1, wherein the helical chiral polymer has an optical purity of 99.00% ee or more.

7. The piezoelectric polymer material according to claim 1, wherein the piezoelectric polymer material has a product of an α crystal content, a degree of crystallinity [%] and a degree of orientation, which are obtained by X-ray diffraction, of 3.0 or more and lower than 100.

8. The piezoelectric polymer material according to claim 1, wherein the piezoelectric polymer material has a degree of orientation obtained by X-ray diffraction of 0.90 or more.

9. The piezoelectric polymer material according to claim 3, wherein the piezoelectric polymer material is obtained by carrying out a drawing process at a temperature higher than the glass transition temperature Tg of the piezoelectric polymer material and lower than the melting point Tm1, and at a compressive stress of from 5 MPa to 10,000 MPa, and wherein the piezoelectric polymer material has a longitudinal elastic modulus in a direction in which the drawing is carried out of from 2.0 GPa to 10.0 GPa.

10. The piezoelectric polymer material according to claim 9, wherein the piezoelectric polymer material has a principal surface area of 5 mm² or more.

11. A piezoelectric element comprising a piezoelectric polymer material having at least two surfaces and electrodes provided on the at least two surfaces of the piezoelectric polymer material, wherein the piezoelectric polymer material is the piezoelectric polymer material according to claim 1.

12. A process for producing a piezoelectric polymer material, the process comprising subjecting a piezoelectric polymer material comprising a helical chiral polymer having a weight average molecular weight of from 50,000 to 1,000,000 and having optical activity, to a drawing process, the drawing process being carried out at a temperature higher than the glass transition temperature Tg of the piezoelectric polymer material and lower than the highest melting point Tm1 derived from the helical chiral polymer among melting points of the piezoelectric polymer material obtained by differential scanning calorimetry and at a compressive stress of from 10 MPa to 10,000 MPa, and the process further comprising, after the drawing process, subjecting the piezoelectric polymer material to an annealing process under a condition of an annealing temperature of from 80° C. to 160° C., and an annealing temperature application time of from 1 second to 300 seconds.

13. The process for producing a piezoelectric polymer material according to claim 12, the process comprising, prior to the drawing process, subjecting the piezoelectric polymer material to a preheating process in which the piezoelectric polymer material is heated at from 60° C. to 170° C. for from 1 minute to 60 minutes.

14. The piezoelectric polymer material according to claim 1, wherein the haze is from 0.5 to 15.61.

15. The piezoelectric polymer material according to claim 1, wherein the piezoelectric polymer material comprises an inorganic filler in an amount of lower than 1% by mass with respect to a total mass of the piezoelectric polymer material.

* * * * *